United States Patent
Eriksen

(10) Patent No.: US 11,287,862 B2
(45) Date of Patent: *Mar. 29, 2022

(54) COOLING SYSTEM FOR A COMPUTER SYSTEM

(71) Applicant: Asetek Danmark A/S, Aalborg East (DK)

(72) Inventor: André Sloth Eriksen, Nibe (DK)

(73) Assignee: Asetek Danmark A/S, Aalborg East (DK)

( * ) Notice: Subject to any disclaimer, the term of this patent is extended or adjusted under 35 U.S.C. 154(b) by 0 days.

This patent is subject to a terminal disclaimer.

(21) Appl. No.: 16/796,086

(22) Filed: Feb. 20, 2020

(65) Prior Publication Data

US 2020/0192446 A1 Jun. 18, 2020

Related U.S. Application Data

(63) Continuation of application No. 15/991,384, filed on May 29, 2018, now Pat. No. 10,599,196, which is a
(Continued)

(51) Int. Cl.
*F28F 7/00* (2006.01)
*G06F 1/20* (2006.01)
(Continued)

(52) U.S. Cl.
CPC ......... *G06F 1/206* (2013.01); *F04D 15/0066* (2013.01); *G06F 1/20* (2013.01);
(Continued)

(58) Field of Classification Search
CPC ...... G06F 1/206; G06F 1/20; G06F 2200/201; F04D 15/0066; H01L 23/473; H01L 2924/0002; H05K 7/20263; H05K 7/20272
(Continued)

(56) References Cited

U.S. PATENT DOCUMENTS 3,810,509 A 5/1974 Kun
4,109,707 A 8/1978 Wilson et al.
(Continued)

FOREIGN PATENT DOCUMENTS

CN 2301566 Y 12/1998
CN 2514544 Y 10/2002
(Continued)

OTHER PUBLICATIONS

Decision Granting Institution of Inter Partes Review, 35 U.S.C. § 314, Coolit Systems, Inc. v. Asetek Danmark A/S, IPR2020-00524, U.S. Pat. No. 9,733,681 B2, Entered Aug. 24, 2020 (33 pages).
(Continued)

*Primary Examiner* — Davis D Hwu
(74) *Attorney, Agent, or Firm* — Finnegan, Henderson, Farabow, Garrett & Dunner LLP

(57) ABSTRACT

The invention relates to a cooling system for a computer system, said computer system comprising at least one unit such as a central processing unit (CPU) generating thermal energy and said cooling system intended for cooling the at least one processing unit and comprising a reservoir having an amount of cooling liquid, said cooling liquid intended for accumulating and transferring of thermal energy dissipated from the processing unit to the cooling liquid. The cooling system has a heat exchanging interface for providing thermal contact between the processing unit and the cooling liquid for dissipating heat from the processing unit to the cooling liquid. Different embodiments of the heat exchanging system as well as means for establishing and controlling a flow of cooling liquid and a cooling strategy constitutes the invention of the cooling system.

12 Claims, 17 Drawing Sheets

Related U.S. Application Data continuation of application No. 15/626,706, filed on Jun. 19, 2017, now Pat. No. 10,078,355, which is a continuation of application No. 13/861,593, filed on Apr. 12, 2013, now Pat. No. 9,733,681, which is a continuation of application No. 11/919,974, filed as application No. PCT/DK2005/000310 on May 6, 2005, now abandoned.

(51) Int. Cl.
    *H01L 23/473* (2006.01)
    *F04D 15/00* (2006.01)
    *H05K 7/20* (2006.01)

(52) U.S. Cl.
    CPC ....... *H01L 23/473* (2013.01); *H05K 7/20263* (2013.01); *H05K 7/20272* (2013.01); *G06F 2200/201* (2013.01); *H01L 2924/0002* (2013.01)

(58) Field of Classification Search
    USPC ............................................. 165/80.4
    See application file for complete search history.

(56) References Cited

U.S. PATENT DOCUMENTS

| | | | |
|---|---|---|---|
| 4,520,298 | A | 5/1985 | Abbondanti |
| 4,563,620 | A | 1/1986 | Komatsu |
| 4,777,578 | A | 10/1988 | Jahns |
| 4,898,579 | A | 2/1990 | Groshong et al. |
| 5,001,548 | A | 3/1991 | Iversen |
| 5,006,924 | A | 4/1991 | Frankeny et al. |
| 5,070,936 | A | 12/1991 | Carroll et al. |
| 5,142,214 | A | 8/1992 | Purson et al. |
| 5,316,077 | A | 5/1994 | Reichard |
| 5,441,102 | A | 8/1995 | Burward-Hoy |
| 5,566,745 | A | 10/1996 | Hill et al. |
| 5,708,564 | A | 1/1998 | Lin |
| 5,731,954 | A | 3/1998 | Cheon |
| 5,763,951 | A | 6/1998 | Hamilton et al. |
| 5,784,257 | A | 7/1998 | Tata |
| 5,825,622 | A | 10/1998 | Rife et al. |
| 5,890,880 | A | 4/1999 | Lustwerk |
| 5,901,037 | A | 5/1999 | Hamilton et al. |
| 6,019,165 | A | 2/2000 | Batchelder |
| 6,021,844 | A | 2/2000 | Batchelder |
| 6,114,827 | A | 9/2000 | Alvaro |
| 6,141,217 | A | 10/2000 | Nakahama et al. |
| 6,166,907 | A | 12/2000 | Chien |
| 6,170,563 | B1 | 1/2001 | Hsieh |
| 6,263,957 | B1 | 7/2001 | Chen et al. |
| 6,305,463 | B1 | 10/2001 | Salmonson |
| 6,343,478 | B1 | 2/2002 | Chang |
| 6,408,937 | B1 | 6/2002 | Roy |
| 6,415,860 | B1 | 7/2002 | Kelly et al. |
| 6,447,270 | B1 | 9/2002 | Schmidt et al. |
| 6,470,289 | B1 | 10/2002 | Peters |
| 6,529,376 | B2 | 3/2003 | Hamman |
| 6,551,734 | B1 | 4/2003 | Simpkins et al. |
| 6,580,610 | B2 | 6/2003 | Morris et al. |
| 6,668,911 | B2 | 12/2003 | Bingler |
| 6,702,002 | B2 | 3/2004 | Wang |
| 6,725,682 | B2 | 4/2004 | Scott |
| 6,728,107 | B2 | 4/2004 | Tseng et al. |
| 6,749,012 | B2 | 6/2004 | Gwin et al. |
| 6,796,370 | B1 | 9/2004 | Doll |
| 6,892,802 | B2 | 5/2005 | Kelly et al. |
| 6,894,899 | B2 * | 5/2005 | Wu .................... F28D 15/0266 165/185 |
| 6,915,653 | B2 | 7/2005 | Nakano et al. |
| 6,945,315 | B1 | 9/2005 | Gektin et al. |
| 6,952,345 | B2 | 10/2005 | Weber et al. |
| 6,967,841 | B1 | 11/2005 | Chu et al. |
| 6,972,954 | B2 | 12/2005 | Minamitani et al. |
| 6,992,887 | B2 | 1/2006 | Jairazbhoy et al. |
| 7,055,581 | B1 | 6/2006 | Roy |
| 7,057,894 | B2 | 6/2006 | Chang |
| 7,100,389 | B1 | 9/2006 | Wayburn et al. |
| 7,156,160 | B2 | 1/2007 | Lee et al. |
| 7,215,546 | B2 | 5/2007 | Hata et al. |
| 7,298,617 | B2 | 11/2007 | Campbell et al. |
| 7,325,588 | B2 | 2/2008 | Malone et al. |
| 7,325,591 | B2 | 2/2008 | Duan et al. |
| 7,359,197 | B2 | 4/2008 | Stefanoski et al. |
| 7,455,103 | B2 | 11/2008 | Sato et al. |
| 7,544,049 | B2 | 6/2009 | Koga |
| 7,591,302 | B1 | 9/2009 | Lenehan et al. |
| 7,971,632 | B2 * | 7/2011 | Eriksen .............. H05K 7/20154 165/80.4 |
| 7,972,632 | B2 | 7/2011 | Jia |
| 8,240,362 | B2 * | 8/2012 | Eriksen .............. H05K 7/20154 165/80.4 |
| 9,715,260 | B2 | 7/2017 | Eriksen |
| 9,733,681 | B2 * | 8/2017 | Eriksen .............. H05K 7/20263 |
| 10,078,354 | B2 * | 9/2018 | Eriksen .............. H05K 7/20263 |
| 10,078,355 | B2 | 9/2018 | Eriksen |
| 10,613,601 | B2 * | 4/2020 | Eriksen .................... G06F 1/20 |
| 2002/0117291 | A1 | 8/2002 | Cheon |
| 2002/0171388 | A1 | 11/2002 | Seki |
| 2003/0010050 | A1 | 1/2003 | Scott |
| 2003/0039097 | A1 | 2/2003 | Igarashi |
| 2003/0056939 | A1 | 3/2003 | Chu et al. |
| 2003/0151895 | A1 | 8/2003 | Zuo |
| 2004/0042176 | A1 | 3/2004 | Niwatsukino et al. |
| 2004/0052048 | A1 | 3/2004 | Wu et al. |
| 2004/0052049 | A1 | 3/2004 | Wu et al. |
| 2004/0052663 | A1 | 3/2004 | Laing et al. |
| 2004/0105232 | A1 | 6/2004 | Ito et al. |
| 2004/0141275 | A1 | 7/2004 | Athari |
| 2004/0190254 | A1 | 9/2004 | Hu et al. |
| 2004/0233632 | A1 | 11/2004 | Chang |
| 2005/0052847 | A1 | 3/2005 | Hamman |
| 2005/0061482 | A1 | 3/2005 | Lee et al. |
| 2005/0069432 | A1 | 3/2005 | Tomioka |
| 2005/0083656 | A1 | 4/2005 | Hamman |
| 2005/0098305 | A1 | 5/2005 | Lee et al. |
| 2005/0126750 | A1 | 6/2005 | Yokozawa et al. |
| 2005/0128705 | A1 | 6/2005 | Chu et al. |
| 2005/0183848 | A1 | 8/2005 | Cheng et al. |
| 2005/0243518 | A1 | 11/2005 | Hata et al. |
| 2006/0113066 | A1 | 6/2006 | Mongia et al. |
| 2006/0157230 | A1 | 7/2006 | Kawahara et al. |
| 2006/0161311 | A1 | 7/2006 | Vinson et al. |
| 2006/0169440 | A1 | 8/2006 | Chou et al. |
| 2006/0185830 | A1 | 8/2006 | Duan |
| 2007/0000268 | A1 | 1/2007 | Crocker et al. |
| 2016/0146219 | A1 * | 5/2016 | Lyon ........................ F04D 1/00 417/53 |

FOREIGN PATENT DOCUMENTS

| | | |
|---|---|---|
| CN | 1387311 A | 12/2002 |
| CN | 2562368 | 7/2003 |
| CN | 2574219 Y | 9/2003 |
| CN | 2580157 Y | 10/2003 |
| CN | 2612070 Y | 4/2004 |
| CN | 1510310 A | 7/2004 |
| CN | M24451 | 9/2004 |
| CN | 2658823 Y | 11/2004 |
| CN | 2667208 Y | 12/2004 |
| CN | 1580576 A | 2/2005 |
| CN | 2687734 Y | 3/2005 |
| CN | 1603591 A | 4/2005 |
| CN | 2772026 | 4/2006 |
| DE | 195 34 423 A1 | 3/1997 |
| EP | 0105687 A1 | 4/1984 |
| EP | 0574823 A2 | 12/1993 |
| EP | 0610826 A2 | 8/1994 |
| EP | 0400455 A1 | 5/1999 |
| JP | 2002-151638 | 5/2002 |
| JP | 2002-151638 A | 5/2002 |
| JP | 3452059 | 9/2003 |
| KR | 10-2003-0031027 | 4/2003 |

(56) References Cited

FOREIGN PATENT DOCUMENTS

| TW | 159299 | 1/1995 |
|---|---|---|
| TW | 577588 | 2/2004 |
| TW | I220468 | 8/2004 |
| TW | M251442 U | 11/2004 |
| TW | M253531 | 12/2004 |
| TW | M256682 U | 2/2005 |
| WO | WO 01/25881 A | 4/2001 |
| WO | WO 2005/017468 A2 | 2/2005 |
| WO | WO 2005/045654 A2 | 5/2005 |
| WO | PCT/DK2005/000310 | 11/2006 |
| WO | WO 2006/119761 | 11/2006 |

OTHER PUBLICATIONS

Decision Granting Institution of Inter Partes Review, 35U.S.C. § 314, Coolit Systems, Inc. v. Asetek Danmark A/S, IPR2020-00522, U.S. Pat. No. 10,078,355 B2, Entered Aug. 24, 2020 (24 pages).
Decision Granting Institution of Inter Partes Review, 35U.S.C. § 314, Coolit Systems, Inc. v. Asetek Danmark A/S, IPR2020-00523, U.S. Pat. No. 10,078,354 B2, Entered Aug. 24, 2020 (18 pages).
Notice of Allowability with Examiner's Reason for Allowance dated May 17, 2012 in U.S. Appl. No. 12/826,768 (4 pages).
Notice of Allowability with Examiner's Reason for Allowance dated May 23, 2012 in U.S. Appl. No. 13/269,234 (4 pages).
Notice of Allowability with Examiner's Reason for Allowance dated Apr. 8, 2011 in U.S. Appl. No. 10/578,578 (9 pages).
Order re: Claim Construction for U.S. Pat. Nos. 8,240,362 and 8,245,764 in U.S. District Court, Northern District of California, Case Nos. C-12-4498 EMC and C-13-0457 JST, filed Dece. 3, 2013 (18 pages).
Third Party Observation for European Application No. EP20080100686 submitted on Aug. 15, 2014 (8 pages).
Third Party Observation for European Application No. EP20080100686 submitted on Aug. 18, 2014 (7 pages).
Invalidation Decision in CN 102902329B dated Dec. 29, 2017 (28 pages).
Request for Invalidation in CN 102902329B filed Jun. 25, 2019 (43 pages).
Decision of Institution of Invalidation Proceeding in CN 102902329B dated Jul. 4, 2019 (4 pages).
Office Action dated Aug. 22, 2007 in U.S. Appl. No. 10/578,578 (7 pages).
Office Action dated Apr. 25, 2008 in U.S. Appl. No. 10/578,578 (10 pages).
Office Action dated Aug. 18, 2008 in U.S. Appl. No. 10/578,578 (9 pages).
Office Action dated Mar. 20, 2009 in U.S. Appl. No. 10/578,578 (12 pages).
Office Action dated Jul. 15, 2009 in U.S. Appl. No. 10/578,578 (13 pages).
Office Action dated Apr. 13, 2010 in U.S. Appl. No. 10/578,578 (14 pages).
Office Action dated Nov. 24, 2010 in U.S. Appl. No. 10/578,578 (10 pages).
Office Action dated Nov. 23, 2011 in U.S. Appl. No. 12/826,802 (11 pages).
Office Action dated Dec. 5, 2011 in U.S. Appl. No. 12/826,768 (14 pages).
Office Action dated Dec. 20, 2011 in U.S. Appl. No. 13/269,234 (13 pages).
Office Action dated Mar. 13, 2012 in U.S. Appl. No. 13/269,234 (12 pages).
Office Action dated Mar. 27, 2012 in U.S. Appl. No. 11/919,974 (21 pages).
Office Action dated Sep. 12, 2012 in U.S. Appl. No. 13/547,240 (11 pages).
Office Action dated Jan. 16, 2013 in U.S. Appl. No. 13/547,240 (9 pages).
Office Action dated Mar. 23, 2016 in U.S. Appl. No. 13/942,922 (13 pages).
Office Action dated Aug. 10, 2016 in U.S. Appl. No. 13/942,922 (18 pages).
Office Action dated Feb. 24, 2017 in U.S. Appl. No. 15/347,938 (11 pages).
Notice of Allowance dated May 15, 2017 in U.S. Appl. No. 15/347,938 (18 pages).
Office Action dated Oct. 12, 2012 in U.S. Appl. No. 11/919,974 (14 pages).
Office Action dated Oct. 6, 2016 in U.S. Appl. No. 13/861,593 (8 pages).
Office Action dated Feb. 3, 2017 in U.S. Appl. No. 13/861,593 (18 pages).
Notice of Allowance dated Jun. 7, 2017 in U.S. Appl. No. 13/861,593 (16 pages).
Invalidation Decision in CN 102902329B dated Feb. 3, 2020 (15 pages).

* cited by examiner

COOLING SYSTEM FOR A COMPUTER SYSTEM

This application is a continuation of U.S. application Ser. No. 15/991,384, filed May 29, 2018, which is a continuation of U.S. application Ser. No. 15/626,706, filed Jun. 19, 2017 (issued Sep. 18, 2018 as U.S. Pat. No. 10,078,355 B2), which is a continuation of U.S. application Ser. No. 13/861,593, filed Apr. 12, 2013 (issued Aug. 15, 2017 as U.S. Pat. No. 9,733,681 B2), which is a continuation of U.S. application Ser. No. 11/919,974, filed Jan. 6, 2009, which is a U.S. National Stage Application of PCT/DK2005/000310, filed May 6, 2005, all of which are incorporated herein by reference in their entirety.

BACKGROUND

The present invention relates to a cooling system for a central processing unit (CPU) or other processing unit of a computer system. More specifically, the invention relates to a liquid-cooling system for a mainstream computer system such as a PC.

During operation of a computer, the heat created inside the CPU or other processing unit must be carried away fast and efficiently, keeping the temperature within the design range specified by the manufacturer. As an example of cooling systems, various CPU cooling methods exist and the most used CPU cooling method to date has been an air-cooling arrangement, wherein a heat sink in thermal contact with the CPU transports the heat away from the CPU and as an option a fan mounted on top of the heat sink functions as an air fan for removing the heat from the heat sink by blowing air through segments of the heat sink. This air-cooling arrangement is sufficient as long as the heat produced by the CPU is kept at today's level, however it becomes less useful in future cooling arrangements when considering the development of CPUs since the speed of a CPU is said to double perhaps every 18 months, thus increasing the heat production accordingly.

Another design used today is a CPU cooling arrangement where cooling liquid is used to cool the CPU by circulating a cooling liquid inside a closed system by means of a pumping unit, and where the closed system also comprises a heat exchanger past which the cooling liquid is circulated.

A liquid-cooling arrangement is more efficient than an air-cooling arrangement and tends to lower the noise level of the cooling arrangement in general. However, the liquid-cooling design consists of many components, which increases the total installation time, thus making it less desirable as a mainstream solution. With a trend of producing smaller and more compact PCs for the end-users, the greater amount of components in a typical liquid-cooling arrangement is also undesirable. Furthermore, the many components having to be coupled together incurs a risk of leakage of cooling liquid from the system.

SUMMARY

It may be one object of the invention to provide a small and compact liquid-cooling solution, which is more efficient than existing air-cooling arrangements and which can be produced at a low cost enabling high production volumes. It may be another object to create a liquid-cooling arrangement, which is easy-to-use and implement, and which requires a low level of maintenance or no maintenance at all. It may be still another object of the present invention to create a liquid-cooling arrangement, which can be used with existing CPU types, and which can be used in existing computer systems.

This object may be obtained by a cooling system for a computer system, said computer system comprising: at least one unit such as a central processing unit (CPU) generating thermal energy and said cooling system intended for cooling the at least one processing unit, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pump being provided as part of an integrate element, said integrate element comprising the heat exchanging interface, the reservoir and the pump, said pump intended for pumping the cooling liquid into the reservoir, through the reservoir and from the reservoir to a heat radiating means, said heat radiating means intended for radiating thermal energy from the cooling liquid, dissipated to the cooling liquid, to surroundings of the heat radiating means.

By providing an integrate element, it is possible to limit the number of separate elements of the system. However, there is actually no need for limiting the number of elements, because often there is enough space within a cabinet of a computer system to encompass the different individual elements of the cooling system. Thus, it is surprisingly that, at all, any attempt is conducted of integrating some of the elements.

In possible embodiments according to this aspect of the invention, the entire pump is placed inside the reservoir with at least an inlet or an outlet leading to the liquid in the reservoir. In an alternative embodiment the pump is placed outside the reservoir in the immediate vicinity of the reservoir and wherein at least an inlet or an outlet is leading directly to the liquid in the reservoir. By placing the pump inside the reservoir or in the immediate vicinity outside the reservoir, the integrity of the combined reservoir, heat exchanger and pump is obtained, so that the element is easy to employ in new and existing computer systems, especially mainstream computer systems.

In a preferred embodiment, the pumping member of the pump and a driven part of the motor of the pump, such as a rotor of en electrical motor, is placed inside the reservoir embedded in the cooling liquid, and wherein a stationary part of the motor of the pump, such as a stator of an electrical motor, is placed outside the reservoir. By having the driven part of the motor placed inside the reservoir submerged in the cooling liquid and the stationary part of the motor outside the reservoir, there is no need for encapsulating the stationary part in a liquid-proof insulation. However, problems may occur having then stationary part driving the driven part. However, the present invention provide means for obtaining such action, although not at all evident how to solve this problem.

The object may also be obtained by a cooling system for a computer system, said computer system comprising: at least one unit such as a central processing unit (CPU) generating thermal energy and said cooling system intended for cooling the at least one processing unit, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pump intended for pumping the cooling liquid into the reservoir, through the reservoir and from the reservoir to a heat radiating means, said cooling system being intended for thermal contact with the processing unit by means of existing fastening means associated with the processing unit, and said heat radiating means intended for radiating from the cooling liquid thermal energy, dissipated to the cooling liquid, to surroundings of the heat radiating means.

The use of existing fastening means has the advantage that fitting of the cooling system is fast and easy. However, once again there is no problem for the person skilled in the art to adopt specially adapted mounting means for any element of the cooling system, because there are numerous possibilities in existing cabinets of computer systems for mounting any kind of any number of elements, also elements of a cooling system.

In preferred embodiments according to this aspect of the invention, the existing fastening means are means intended for attaching a heat sink to the processing unit, or the existing fastening means are means intended for attaching a cooling fan to the processing unit, or the existing fastening means are means intended for attaching a heat sink together with a cooling fan to the processing unit. Existing fastening means of the kind mentioned is commonly used for air cooling of CPUs of computer systems, however, air cooling arrangements being much less complex than liquid cooling systems. Nevertheless, it has ingeniously been possible to develop a complex and effective liquid cooling system capable of utilising such existing fastening means for simple and less effective air cooling arrangements.

According to an aspect of the invention, the pump is selected from the following types: Bellows pump, centrifugal pump, diaphragm pump, drum pump, flexible liner pump, flexible impeller pump, gear pump, peristaltic tubing pump, piston pump, processing cavity pump, pressure washer pump, rotary lobe pump, rotary vane pump and electro-kinetic pump. By adopting one or more of the solution of the present invention, a wide variety of pumps may be used without departing from the scope of the invention.

According to another aspect of the invention, driving means for driving the pump is selected among the following driving means: electrically operated rotary motor, piezo-electrically operated motor, permanent magnet operated motor, fluid-operated motor, capacitor-operated motor. As is the case when selecting the pump to pump the liquid, by adopting one or more of the solution of the present invention, a wide variety of pumps may be used without departing from the scope of the invention.

The object may also be obtained by a cooling system for a computer system, said computer system comprising: at least one unit such as a central processing unit (CPU) generating thermal energy and said cooling system intended for cooling the at least one processing unit, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pump intended for pumping the cooling liquid into the reservoir, through the reservoir and from the reservoir to a heat radiating means, and said cooling system further comprising a pump wherein the pump is driven by an AC electrical motor by a DC electrical power supply of the computer system, where at least part of the electrical power from said power supply is intended for being converted to AC being supplied to the electrical motor.

It may be advantageous to use an AC motor, such as a 12V AC motor, for driving the pump in order to obtain a stabile unit perhaps having to operate 24 hours a day, 365 days a year. However, the person skilled in the art will find it unnecessary to adopt as example a 12V motor because high voltage such as 220V or 110V is readily accessible as this is the electrical voltage used to power the voltage supply of the computer system itself. Although choosing to use a 12V motor for the pump, it has never been and will never be the choice of the person skilled in the art to use an AC motor. The voltage supplied by the voltage supply of the computer system itself is DC, thus this will be the type of voltage chosen by the skilled person.

In preferred embodiments according to any aspect of the invention, an electrical motor is intended both for driving the pump for pumping the liquid and for driving the a fan for establishing a flow of air in the vicinity of the reservoir, or an electrical motor is intended both for driving the pump for pumping the liquid and for driving the a fan for establishing a flow of air in the vicinity of the heat radiating means, or an electrical motor is intended both for driving the pump for pumping the liquid, and for driving the a fan for establishing a flow of air in the vicinity of the reservoir, and for driving the a fan for establishing a flow of air in the vicinity of the heat radiating means.

By utilising a single electrical motor for driving more than one element of the cooling system according to any of the aspects of the invention, the lesser complexity and the reliability of the cooling system will be further enhanced.

The heat exchanging interface may be an element being separate from the reservoir, and where the heat exchanging interface is secured to the reservoir in a manner so that the heat exchanging interface constitutes part of the reservoir when being secured to the reservoir. Alternatively, the heat exchanging interface constitutes an integrate surface of the reservoir, and where the heat exchanging surface extends along an area of the surface of the reservoir, said area of surface being intended for facing the processing unit and said area of surface being intended for the close thermal contact with the processing unit. Even alternatively, the heat exchanging interface is constitutes by a free surface of the processing unit, and where the free surface is capable of establishing heat dissipation between the processing unit and the cooling liquid through an aperture provided in the reservoir, and where the aperture extends along an area of the surface of the reservoir, said surface being intended for facing the processing unit.

Possibly, an uneven surface such as pins or fins extending from the copper plate provide a network of channels across the inner surface of the heat exchanging interface. A network of channels ensure the cooling liquid being passed along the inner surface of the interface such as a copper plate in a way that maximises the retention time of the cooling liquid along the heat exchanging interface and in a way that optimises the thermal exchange between the heat exchanging interface and the cooling liquid as long as the cooling liquid is in thermal contact with heat exchanging interface.

Possibly, the cooling system may be provided with a heat exchanging interface for providing thermal contact between the processing unit and the cooling liquid for dissipating heat from the processing unit to the cooling liquid, a pumping means being intended for pumping the cooling liquid into the reservoir, through the reservoir and from the reservoir to a heat radiating means, said heat radiating means intended for radiating thermal energy from the cooling liquid, dissipated to the cooling liquid, to surroundings of the heat radiating means, said heat exchanging interface constituting a heat exchanging surface being manufactured from a material suitable for heat conducting, and with a first side of the heat exchanging surface facing the central processing unit being substantially plane and with a second side of the heat exchanging surface facing the cooling liquid being substantially plane and said reservoir being manufactured from plastic, and channels or segments being provided in the reservoir for establishing a certain flow-path for the cooling liquid through the reservoir.

Providing a plane heat exchanging surface, both the first, inner side being in thermal contact with the cooling liquid and the second, outer side being in thermal contact with the heat generating processing unit, results in the costs for manufacturing the heat exchanging surface is reduced to an absolute minimum.

According to the above possible solution, an inlet of the pumping means is positioned in immediate vicinity of the heat exchanging interface for thereby obtaining a turbulence of flow of the cooling liquid in the immediate vicinity of the heat exchanging interface. The turbulence of flow is advantageous for obtaining a heat dissipation. If the heat exchanging interface is plane, the inlet of the pump being positioned as mentioned above, may result in a turbulence of flow occurring along the heat exchanging interface, at least in the vicinity of the inlet of the pump, but possibly also distant form the inlet.

Alternatively, or additionally, an outlet of said pumping means being positioned in immediate vicinity of the heat exchanging interface for thereby obtaining a turbulence of flow of the cooling liquid in the immediate vicinity of the heat exchange interface. The turbulence of flow is advantageous for obtaining a heat dissipation. If the heat exchanging interface is plane, the inlet of the pump being positioned as mentioned above, may result in a turbulence of flow occurring along the heat exchanging interface, at least in the vicinity of the inlet of the pump, but possibly also distant form the inlet.

However, a plane first, inner surface may also result in the cooling liquid passing the heat exchanging surface too fast. This may be remedied by providing grooves along the inner surface, thereby providing a flow path in the heat exchanging surface. This however results in the costs for manufacturing the heat exchanging surface increasing.

The solution to this problem has been dealt with by providing channels or segments in the reservoir housing in stead. The reservoir housing may be manufactured by injection moulding or by casting, depending on the material which the reservoir housing is made from. Proving channels or segments during moulding or casting of the reservoir housing is much more cost-effective than milling grooves along the inner surface of the heat exchanging surface.

Possibly, the cooling system may be provided with at least one liquid reservoir mainly for dissipating or radiating heat, said heat being accumulated and transferred by said cooling liquid, said cooling system being adapted such as to provide transfer of said heat from a heat dissipating surface to a heat radiating surface where said at least one liquid reservoir being provided with one aperture intended for being closed by placing said aperture covering part of, alternatively covering the whole of, the at least one processing unit in such a way that a free surface of the processing unit is in direct heat exchanging contact with an interior of the reservoir, and thus in direct heat exchanging contact with the cooling liquid in the reservoir, through the aperture.

Heat dissipation from the processing unit to the cooling liquid must be very efficient to ensure proper cooling of the processing unit, Especially in the case, where the processing unit is a CPU, the surface for heat dissipation is limited by the surface area of the CPU. This may be remedied by utilising a heat exchanging surface being made of a material having a high thermal conductivity such as copper or aluminium and ensuring a proper thermal bondage between the heat exchanging interface and the CPU.

However, in a possible embodiment according to the features in the above paragraph, the heat dissipation takes place directly between the processing unit and the cooling liquid by providing an aperture in the reservoir housing, said aperture being adapted for taking up a free surface of the processing unit. Thereby, the free surface of the processing unit extends into the reservoir or constitutes a part of the boundaries of the reservoir, and the cooling liquid has direct access to the free surface of the processing unit.

A possible heat exchanging interface may be the direct contact between the heat generating unit such as a CPU and the cooling liquid, where at least one unit such as a central processing unit (CPU) generating thermal energy and said cooling system intended for cooling the at least one processing unit comprising at least one liquid reservoir mainly for dissipating or radiating heat, said heat being accumulated and transferred by said cooling liquid, said cooling system being adapted such as to provide transfer of said heat from a heat dissipating interface to a heat radiating surface where said at least one liquid reservoir being provided with one aperture intended for being closed by placing said aperture covering part of, alternatively covering the whole of, the at least one processing unit in such a way that a free surface of the processing unit is in direct heat exchanging contact with an interior of the reservoir, and thus in direct heat exchanging contact with the cooling liquid in the reservoir, through the aperture.

The aperture of the reservoir may be intended for being closed by attaching boundaries of said aperture to a free surface of a the processing unit, said boundaries being liquid-proof when attached to the free surface of the processing unit so that the liquid may flow freely across the free surface without the risk of the liquid dissipating through the boundaries. Alternatively, but posing the same technical effect, the aperture of the reservoir is intended for being closed by attaching boundaries of said aperture along boundaries of a free surface of the processing unit.

If a heat sink is provided as an aid in dissipating heat from the heat generating unit such as a CPU, the aperture of the reservoir may be intended for being closed by attaching boundaries of said aperture to a free surface of a heat sink. Alternatively, the aperture of the reservoir may be intended for being closed by attaching boundaries of said aperture along boundaries of a free surface of a heat sink. Alternatively, possibly, the heat exchanging interface may be provided as a first reservoir intended for being closed by attaching boundaries of an aperture in the first reservoir to, alternatively along, a free surface of a said processing unit, and a second reservoir intended for being closed by attaching boundaries of an aperture in the second reservoir to, alternatively along, a free surface of a to a free surface of a heat sink, and liquid conducting means provided between the first reservoir and the second reservoir.

The first reservoir may be closed by attaching said first reservoir to a heat exchanging surface element being in close thermal contact with the processing unit, said heat exchanging surface intended for dissipating heat from the processing unit to cooling liquid in the first reservoir, and wherein a second reservoir is closed by attaching said second reservoir to a surface of a heat sink, said heat sink intended for radiating heat from cooling liquid in the second reservoir to the exterior surroundings.

Also, the first reservoir and said second reservoir may be provided as a monolithic structure comprising both the first reservoir and the second reservoir and where both a heat dissipation from the processing unit to the cooling liquid in the first reservoir and heat radiation from the cooling liquid in the second reservoir to exterior surrounding is provided by the monolithic structure. The said monolithic structure may preferably be manufactured at least partly from plastic, preferably being manufactured fully in plastic, and said monolithic structure thus being manufactured by injection moulding.

Transfer of said cooling liquid from an outlet of the first reservoir to an inlet of the second reservoir, and from an outlet of the second reservoir to an inlet of the first reservoir, and circulating the cooling liquid within said liquid conducting means is provided by a pumping means being intended for pumping the cooling liquid. One of said reservoirs of said monolithic structure may comprise said pumping means.

An inlet and/or an outlet and/or a pumping member of said pumping means, may be provided in the vicinity of said substantially plane side in order to provide a turbulence of flow and hereby improve the exchange of heat between said cooling liquid and substantially plane side, and the inlet of the pumping means may be provided within the first reservoir and the outlet may be provided within the second reservoir.

According to one aspect of the invention, a method is envisaged, said method of cooling a computer system comprising at least one unit such as a central processing unit (CPU) generating thermal energy and said method utilising a cooling system for cooling the at least one processing unit and, said cooling system comprising a reservoir, at least one heat exchanging interface and a pumping means, said method of cooling comprising the steps of establishing, or defining, or selecting an operative status of the pumping means controlling the operation of the motor of the pumping means in response to the following parameters; the necessary direction of movement for obtaining a pumping action of a pumping member of the pumping means, the possible direction of movement of a driving part of the motor of the pumping means, and in accordance with the operative status being established, defined or selected, controlling the operation of the computer system in order to achieve the necessary direction of movement of the driving part of the motor for establishing the necessary direction of movement for obtaining he pumping action of the pumping member.

There may be pumping means, where the pumping member is only operationable in one direction but where the motor driving the pumping member is operationable in two directions. The solution to this problem is to either choose a pumping member operationable in both directions or to chose a motor being operationable in only one direction. According to the invention, a solution is provided where a one-way directional pumping member may be operated any a two-way directional motor. Despite the contradictory nature of this solution, advantages may however be present.

As example, the method is being applied to a cooling system where the pumping member is a rotary impeller having a one-way direction for obtaining a pumping action, and where the motor of the pumping means is an electrical AC motor having a rotor constituting the driving part of the motor, and where said method comprises the step of establishing, or defining, or selecting a rotary position of the rotor of the electrical AC motor, and applying at least one half-wave of an AC power signal to the stator of the AC motor before applying a full-wave AC power signal.

As an alternative example, the method is being applied to a cooling system where the pumping member is a rotary impeller having a one-way direction for obtaining a pumping action, and where the motor of the pumping means is an electrical AC motor having a rotor constituting the driving part of the motor, and said method comprises the step of establishing, or defining, or selecting a rotary position of the rotor of the electrical AC motor, and applying at least one half-wave of an AC power signal to the stator of the AC motor after having applied the full-wave AC power signal.

In both the above examples, the advantages of the one-way impeller from a traditional DC pump together with the advantages of a motor from a traditional AC pump is obtained in the solution mentioned. The performance of an impeller of a DC pump is much better than the performance of an impeller from an AC pump. The motor from an AC pump is more reliable than a motor from a DC pump. The advantageous obtained is thus of synergetic nature, seeing that different advantages of the impeller of the DC pump and of the motor of the AC pump are different in nature.

According to another aspect of the invention, a method is envisaged, said method of cooling a computer system comprising at least one unit such as a central processing unit (CPU) generating thermal energy and said method utilising a cooling system for cooling the at least one processing unit and, said cooling system comprising a reservoir, at least one heat exchanging interface, an air blowing fan, a pumping means, said method of cooling comprising the steps of applying one of the following possibilities of how to operate the computer system: establishing, or defining, or selecting an operative status of the computer system controlling the operation of at least one of the following means of the computer system; the pumping means and the air blowing fan in response to at least one of the following parameters; a surface temperature of the heat generating processing unit, an internal temperature of the heat generating processing unit, or a processing load of the CPU and in accordance with the operative status being established, defined or selected, controlling the operation of the computer system in order to achieve at least one of the following conditions; a certain cooling performance of the cooling system, a certain electrical consumption of the cooling system, a certain noise level of the cooling system.

Applying the above method ensures an operation of the computer system being in accordance with selected properties during the use of the computer system. For some applications, the cooling performance is vital such as may be the case when working with image files or when downloading large files from a network during which the processing units is highly loaded and thus generating much heat. For other applications, the electrical power consumption is more vital such as may be the case when utilising domestic computer systems or in large office building in environments where the electrical grid may be weak such as in third countries. In still other applications, the noise generated by the cooling system is to be reduced to a certain level, which may be the case in office buildings with white collar people working alone, or at home, if the domestic computer perhaps is situated in the living room, or at any other location where other exterior considerations have to be dealt with.

According to another aspect of the invention, a method is envisaged, said method being employed with cooling system further comprising a pumping means with an impeller for pumping the cooling liquid through a pumping housing, said pumping means being driven by an AC electrical motor with a stator and a rotor, and said pumping means being provided with a means for sensing a position of the rotor, and wherein the method comprises the following steps: initially establishing a preferred rotational direction of the rotor of the electrical motor before start of the electrical motor, sensing the angular position of the rotor during start, applying an electrical AC voltage to the electrical motor and selecting the signal value, positive or negative, of the AC voltage at start of the electrical motor said selection being made according to the preferred rotational direction, and said application of the AC signal, such as an AC voltage, being performed by the computer system for applying the AC signal, such as an AC voltage, from the electrical power supply of the computer system during conversions of the electrical DC signal, such as a DC voltage, of the power supply to the AC signal, such as an AC voltage, for the electrical motor.

Adopting the above method according to the invention ensures the most efficient circulation of cooling liquid in the cooling system and at the same time ensures the lowest possible energy consumption of the electrical motor driving the impeller. The efficient circulation of the cooling liquid is obtained by means of an impeller being designed for rotation in one rotational direction only, thus optimising the impeller design with regard to the only one rotational direction as opposed to both rotational directions. The low energy consumption is achieved because of the impeller design being optimised, thus limiting the necessary rotational speed of the impeller for obtaining e certain amount of flow of the cooling liquid through the cooling system. A bonus effect of the lowest possible energy consumption being obtained is the lowest possible noise level of the pump also being obtained. The noise level of the pump is amongst other parameters also dependent on the design and the rotational speed of the impeller. Thus, an optimised impeller design and impeller speed will reduce the noise level to the lowest possible in consideration of ensuring a certain cooling capacity.

BRIEF DESCRIPTION OF THE FIGURES

The invention will hereafter be described with reference to the drawings, where.

DETAILED DESCRIPTION

Figure 1:
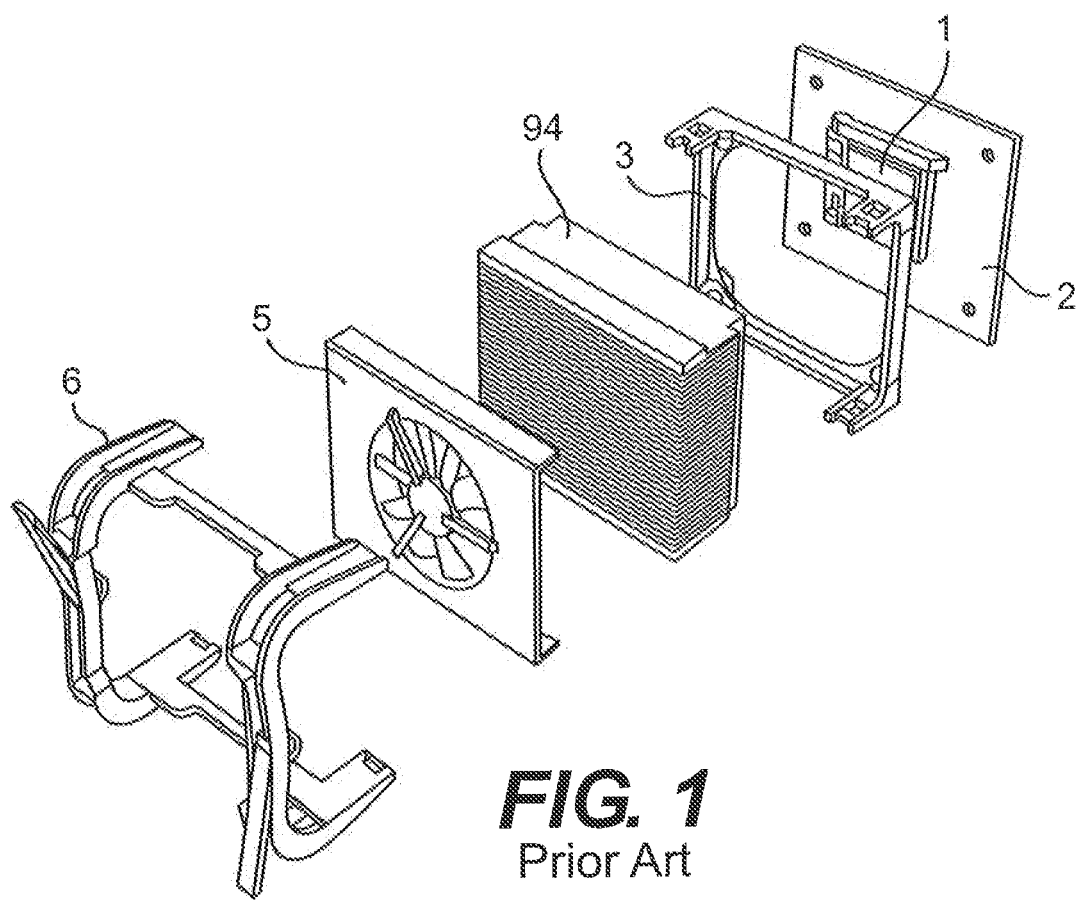
FIG. 1 shows an embodiment of the prior art. The figure shows the typical components in an air-cooling type CPU cooling arrangement.

FIG. 1 is an exploded view of an embodiment of prior art cooling apparatus for a computer system. The figure shows the typical components in an air-cooling type CPU cooling arrangement. The figure shows a prior art heat sink 94 intended for air cooling and provided with segments intersected by interstices, a prior art air fan 5 which is to be mounted on top of the heat sink by use of fastening means 3 and 6.

The fastening means comprises a frame 3 provided with holes intended for bolts, screws, rivets or other suitable fastening means (not shown) for thereby attaching the frame to a motherboard 2 of a CPU 1 or onto another processing unit of the computer system. The frame 3 is also provided with mortises provided in perpendicular extending studs in each corner of the frame, said mortises intended for taking up tenons of a couple of braces. The braces 6 are intended for enclosing the heat sink 94 and the air fan 5 so that the air fan and the heat sink thereby is secured to the frame. Using proper retention mechanisms, when the frame is attached to the motherboard of the CPU of other processing unit, and when the tenons of the braces are inserted into the mortises of the frame, the air fan and heat exchanger is pressed towards the CPU by using a force perpendicular to the CPU surface, said force being provided by lever arms.

Figure 2:
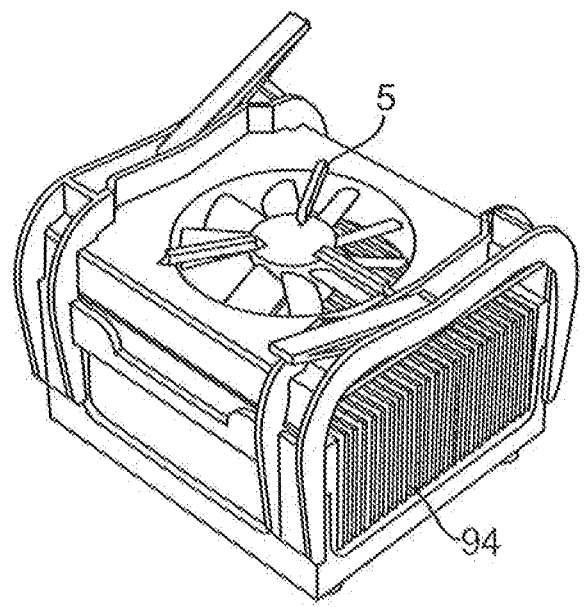
FIG. 2 shows an embodiment of the prior art. The figure shows the parts of the typical air-cooling type CPU cooling arrangement of FIG. 1 when assembled.

FIG. 2 shows the parts of the typical air-cooling type CPU cooling arrangement of FIG. 1, when assembled. The parts are attached to each other and will be mounted on top of a CPU on a motherboard (not shown) of a computer system.

Figure 3:
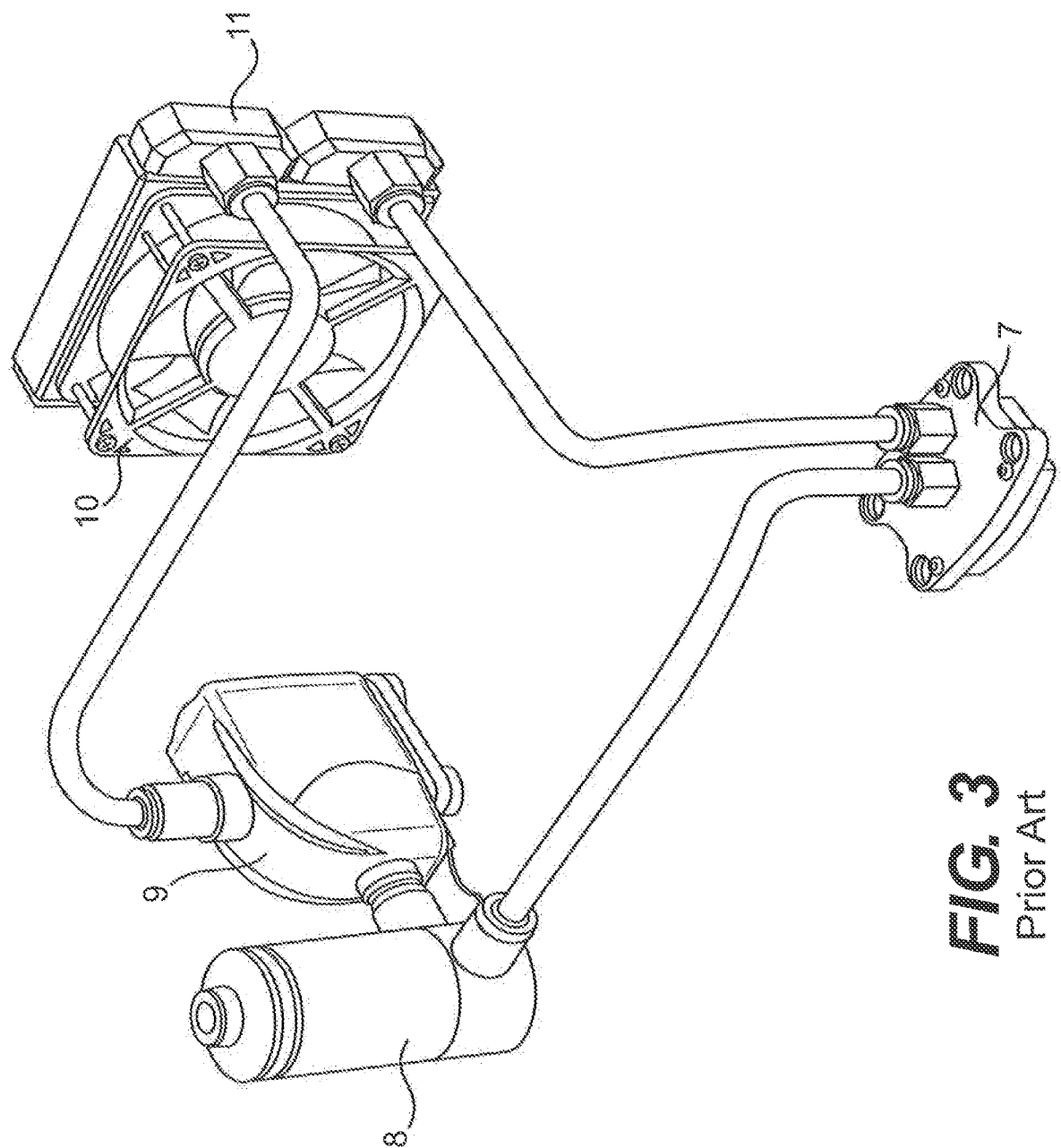
FIG. 3 shows an embodiment of the prior art. The figure shows the typical components in a liquid-cooling type CPU cooling arrangement.

FIG. 3 shows another embodiment of a prior art cooling system. The figure shows the typical components in a liquid-cooling type CPU cooling arrangement. The figure shows a prior art heat exchanger 7, which is in connection with a prior art liquid reservoir 8, a prior art liquid pump 9 and a heat radiator 11 and an air fan 10 provided together with the heat radiator. The prior art heat exchanger 7, which can be mounted on a CPU (not shown) is connected to a radiator and reservoir, respectively. The reservoir serves as a storage unit for excess liquid not capable of being contained in the remaining components. The reservoir is also intended as a means for venting the system of any air entrapped in the system and as a means for filling the system with liquid. The heat radiator 11 serves as a means for removing the heat from the liquid by means of the air fan 10 blowing air through the heat radiator. All the components are in connection with each other via tubes for conducting the liquid serving as the cooling medium.

Figure 4:
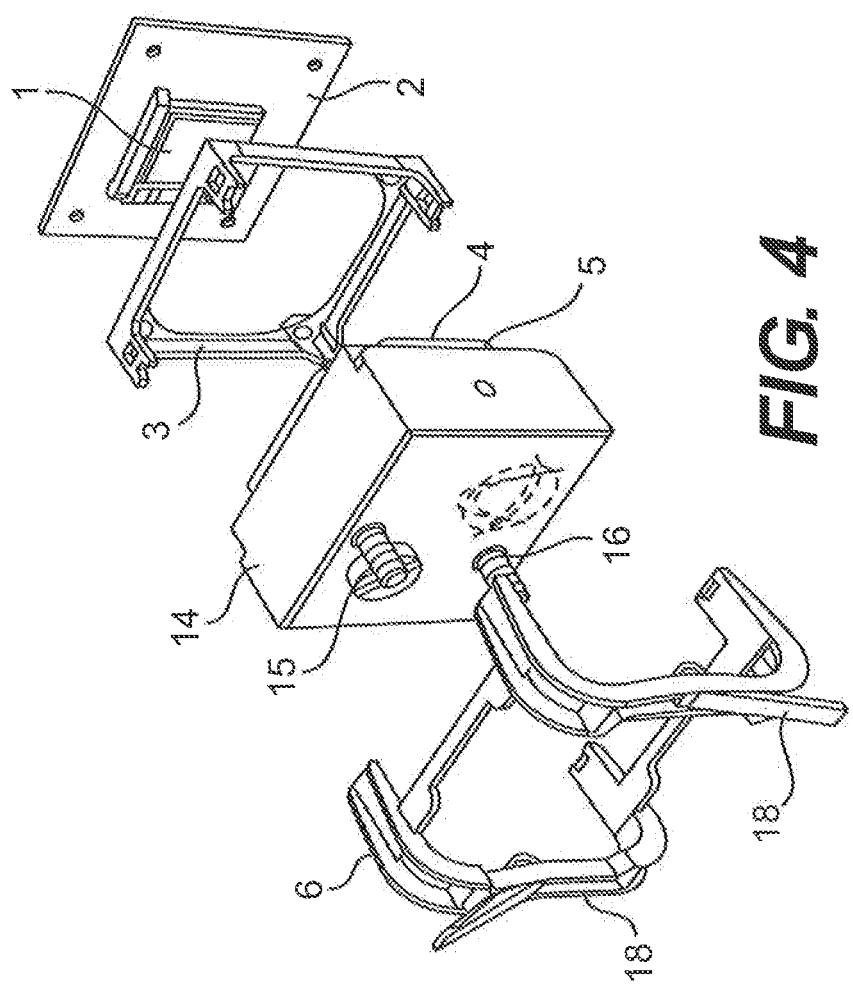
FIG. 4 is an exploded view of the invention and the surrounding elements.

FIG. 4 is an exploded view of a cooling system according to an embodiment of the invention. Also elements not being part of the cooling system as such are shown. The figure shows a central processing unit CPU 1 mounted on a motherboard of a computer system 2. The figure also shows a part of the existing fastening means, i.e. amongst others the frame 3 with mortises provided in the perpendicular extending studs in each corner of the frame. The existing fastening means, i.e. the frame 3 and the braces 6, will during use be attached to the motherboard 2 by means of bolts, screws, rivets or other suitable fastening means extending through the four holes provided in each corner of the frame and extending through corresponding holes in the motherboard of the CPU. The frame 3 will still provide an opening for the CPU to enable the CPU to extend through the frame.

The heat exchanging interface 4 is a separate element and is made of a heat conducting material having a relative high heat thermal conductivity such as copper or aluminium, and which will be in thermal contact with the CPU 1, when the cooling system is fastened to the motherboard 2 of the CPU. The heat exchanging surface constitutes part of a liquid reservoir housing 14, thus the heat exchanger 4 constitutes the part of the liquid reservoir housing facing the CPU. The reservoir may as example be made of plastic or of metal. The reservoir or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part.

If the reservoir is made of metal or any other material having a relative high heat conductivity compared to as example plastic, the heat exchanging interface as a separate element may be excluded because the reservoir itself may constitute a heat exchanger over an area, wherein the reservoir is in thermal contact with the processing unit. Alternatively to having the heat exchanging interface constitute part of the liquid reservoir housing, the liquid reservoir housing may be tightly attached to the heat exchanging interface by means of screws, glue, soldering, brazing or the like means for securing the heat exchanging interface to the housing and vice versa, perhaps with a sealant 5 provided between the housing and the heat exchanging interface.

Alternatively to providing a heat exchanging interface integrate with the reservoir containing the cooling liquid, it will be possible to exclude the heat exchanger and providing another means for dissipating heat from the processing unit to the cooling liquid in the reservoir, The other means will be a hole provided in the reservoir, said hole intended for being directed towards the processing unit. Boundaries of the hole will be sealed towards boundaries of the processing unit or will be sealed on top of the processing unit for thereby preventing cooling liquid from the reservoir from leaking. The only prerequisite to the sealing is that a liquid-tight connection is provided between boundaries of the hole and the processing unit or surrounding of the processing unit, such as a carrier card of the processing unit.

By excluding the heat exchanger, a more effective heat dissipation will be provided from the processing unit and to the cooling liquid of the reservoir, because the intermediate element of a heat exchanger is eliminated. The only obstacle in this sense is the provision of a sealing being fluid-tight in so that the cooling liquid in the reservoir is prevented from leaking.

The heat exchanging surface 4 is normally a copper plate. When excluding the heat exchanging surface 4, which may be a possibility not only for the embodiments shown in FIG. 4, but for all the embodiments of the invention, it may be necessary to provide the CPU with a resistant surface that will prevent evaporation of the cooling liquid and/or any damaging effect that the cooling liquid may pose to the CPU. A resistant surface may be provided the CPU from the CPU producer or it may be applied afterwards. A resistant surface to be applied afterwards may e.g. be a layer, such as an adhesive tape provided on the CPU. The adhesive tape may be made with a thin metal layer e.g. in order to prevent evaporation of the cooling liquid and/or any degeneration of the CPU itself.

Within the liquid reservoir, a liquid pump (not shown) is placed for pumping a cooling liquid from an inlet tube 15 connection being attached to the housing of the reservoir through the reservoir and past the heat exchanger in thermal contact with the CPU to an outlet tube connection 16 also being attached to the reservoir housing. The existing fastening means comprising braces 6 with four tenons and the frame 3 with four corresponding mortises will fasten the reservoir and the heat exchanger to the motherboard of the CPU. When fastening the two parts of the existing fastening means to each other the fastening will by means of the lever arms 18 create a force to assure thermal contact between the CPU 1 mounted on the motherboard and the heat exchanger 4 being provided facing the CPU.

The cooling liquid of the cooling system may be any type of cooling liquid such as water, water with additives such as anti-fungicide, water with additives for improving heat conducting or other special compositions of cooling liquids such as electrically non-conductive liquids or liquids with lubricant additives or anti-corrosive additives.

Figure 5:
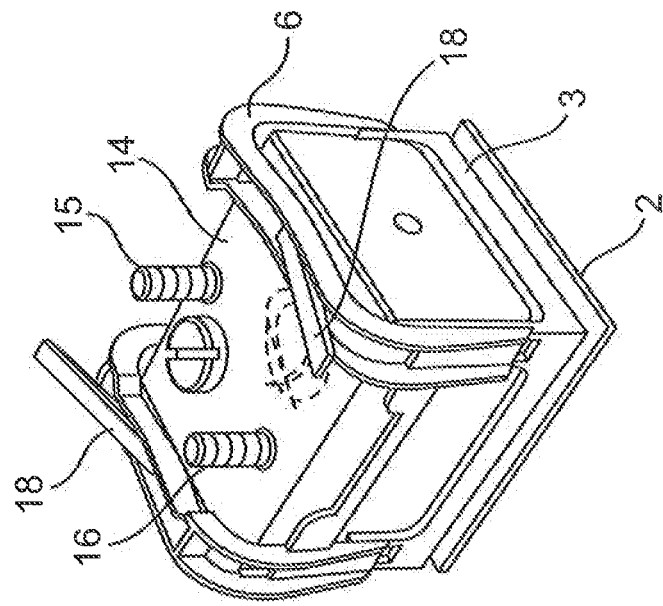
FIG. 5 shows the parts shown in the previous figure when assembled and attached to the motherboard of a computer system.

FIG. 5 shows the parts shown in FIG. 4 when assembled and attached to the motherboard of a CPU of a computer system 2. The heat exchanger and the CPU is in close thermal contact with each other. The heat exchanger and the remainder of the reservoir housing 14 is fastened to the motherboard 2 by means of the existing fastening means being secured to the motherboard of the CPU and by means of the force established by the lever arms 18 of the existing fastening means. The tube inlet connection 15 and the tube outlet connection 16 are situated so as to enable connection of tubes to the connections.

Figure 6:
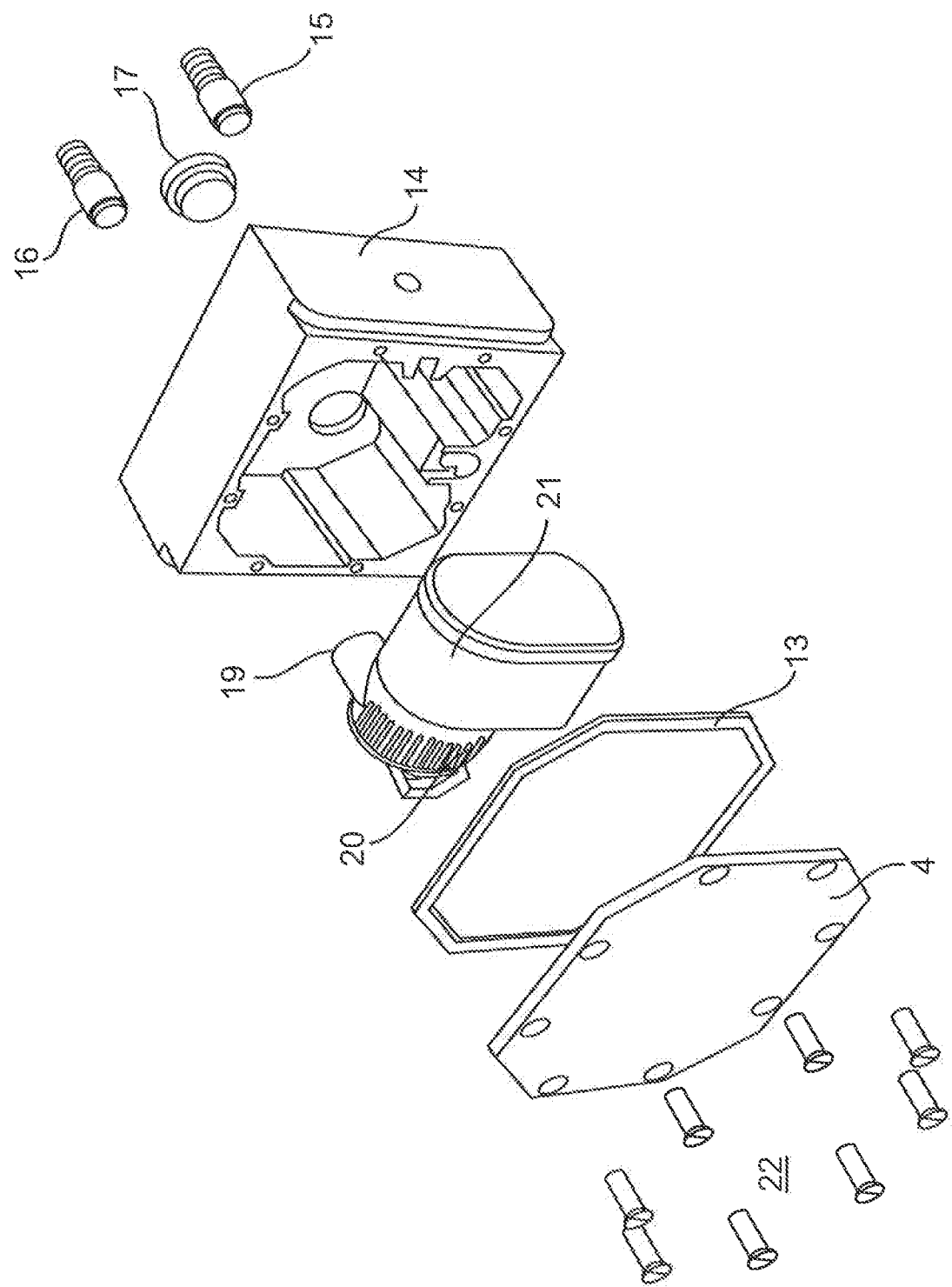
FIG. 6 is an exploded view of the reservoir from the previous FIGS. 4 and 5 seen from the opposite site and also showing the pump.

FIG. 6 is an exploded view of the reservoir shown in previous FIG. 4 and FIG. 5 and seen from the opposite site and also showing the pump 21 being situated inside the reservoir. Eight screws 22 are provided for attaching the heat exchanging surface 4 to the remainder of the reservoir. The heat exchanging surface is preferably made from a copper plate having a plane outer surface as shown in the figure, said outer surface being intended for abutting the free surface of the heat generating component such as the CPU (see FIG. 4). However, also the inner surface (not shown, see FIG. 7) facing the reservoir is plane. Accordingly, the copper plate need no machining other than the shaping of the outer boundaries into the octagonal shape used in the embodiment shown and drilling of holes for insertion of the bolts. No milling of the inner and/or the outer surface need be provided.

A sealant in form of a gasket 13 is used for the connection between the reservoir housing 14 and the heat exchanging surface forming a liquid tight connection. The pump is intended for being placed within the reservoir. The pump has a pump inlet 20 through which the cooling liquid flows from the reservoir and into the pump, and the pump has a pump outlet 19 through which the cooling liquid is pumped from the pump and to the outlet connection. The figure also shows a lid 17 for the reservoir. The non-smooth inner walls of the reservoir and the fact that the pump is situated inside the reservoir will provide a swirling of the cooling liquid inside the reservoir.

Figure 9:
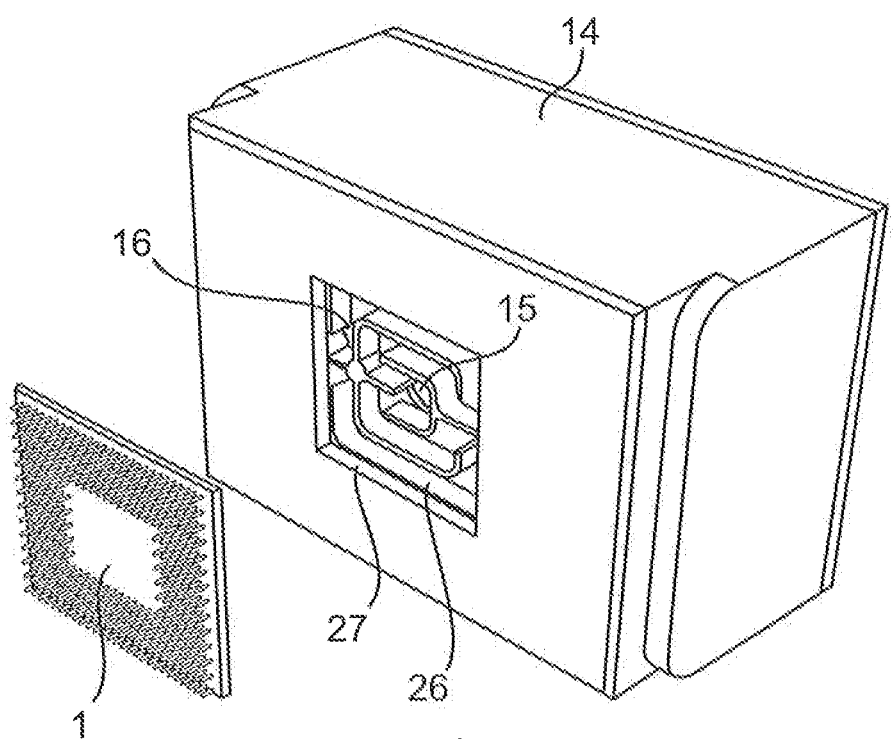
FIG. 9-10 are perspective views of a possible embodiment of reservoir housing providing direct contact between a CPU and a cooling liquid in a reservoir.
Figure 10:
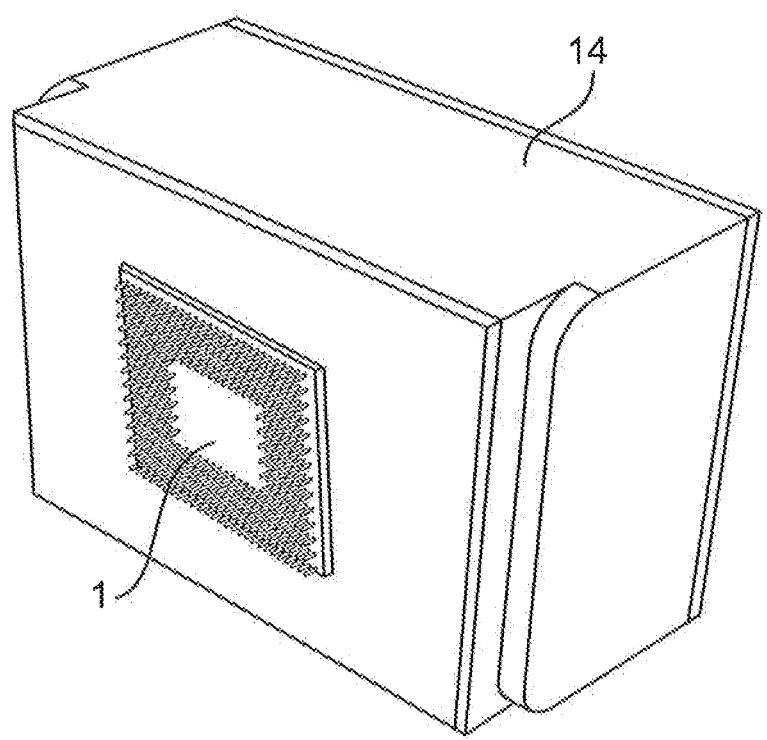
Figure 15:
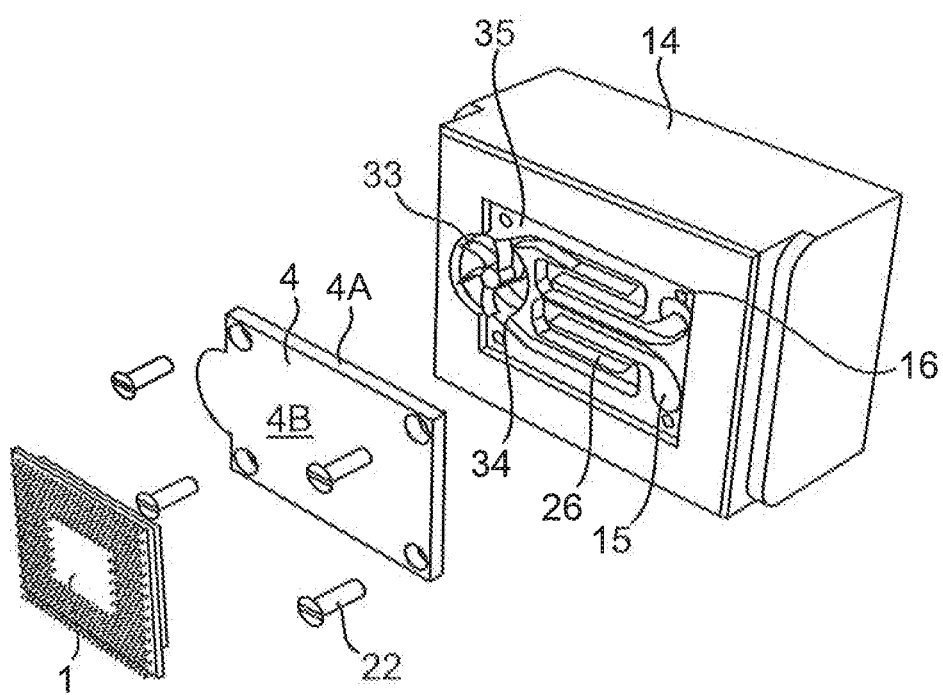
FIG. 15-16 are perspective view of a possible embodiment of a reservoir and a pump and a heat exchanging surface constituting an integrated unit

However, apart from the non-smooth walls of the reservoir and the pump being situated inside the reservoir, the reservoir may be provided with channels or segments for establishing a certain flow-path for the cooling liquid through the reservoir (see FIG. 9-10 and FIG. 15). Channel or segments are especially needed when the inner surface of the heat exchanging surface is plane and/or when the inner walls of the reservoir are smooth and/or if the pump is not situated inside the reservoir. In either of the circumstances mentioned, the flow of the cooling liquid inside the reservoir may result in the cooling liquid passing the reservoir too quickly and not being resident in the reservoir for a sufficient amount of time to take up a sufficient amount of heat from the heat exchanging surface. By providing channels or segments inside the reservoir, a flow will be provided forcing the cooling liquid to pass the heat exchanging surface, and the amount of time increased of the cooling liquid being resident inside the reservoir, thus enhancing heat dissipation. If channels or segments are to be provided inside the reservoir, the shape and of the channels and segments may be decisive of whether the reservoir is to be made of plastic, perhaps by injection moulding, or is to be made of metal such as aluminium, perhaps by die casting.

The cooling liquid enters the reservoir through the tube inlet connection 15 and enters the pump inlet 20, and is pumped out of the pump outlet 19 connected to the outlet connection 16. The connection between the reservoir and the inlet tube connection and the outlet tube connection, respectively, are made liquid tight. The pump may not only be a self-contained pumping device, but may be made integrated into the reservoir, thus making the reservoir and a pumping device one single integrated component. This single integrated element of the reservoir and the pumping device may also be integrated, thus making the reservoir, the pumping device and the heat exchanging surface one single integrated unit. This may as example be possible if the reservoir is made of a metal such as aluminium. Thus, the choice of material provides the possibility of constituting both the reservoir and a heat exchanging surface having a relatively high heat conductivity, and possibly also renders the possibility of providing bearings and the like constructional elements for a motor and a pumping wheel being part of the pumping device.

In an alternative embodiment, the pump is placed in immediate vicinity of the reservoir, however outside the reservoir. By placing the pump outside, but in immediate vicinity of the reservoir, still an integrate element may be obtained. The pump or the inlet or the outlet is preferably positioned so as to obtain a turbulence of flow in the immediate vicinity of the heat exchanging interface, thereby promoting increased heat dissipation between the heat exchanging interface end the cooling liquid, even in the alternative, a pumping member such as an impeller (see FIG. 15-16) may be provided in the immediate vicinity of the heat exchanging surface. The pumping member itself normally introduces a turbulence of flow, and thereby the increased heat dissipation is promoted irrespective of the position of the pump itself, or the position of the inlet or of the outlet to the reservoir or to the pump.

The pump may be driven by an AC or a DC electrical motor. When driven by an AC electrical motor, although being technically and electrically unnecessary in a computer system, this may be accomplished by converting part of the DC electrical power of the power supply of the computer system to AC electrical power for the pump. The pump may be driven by an electrical motor at any voltage common in public electrical networks such as 110V or 220V. However, in the embodiment shown, the pump is driven by a 12V AC electrical motor.

Control of the pump in case the pump is driven by an AC electrical motor, preferably takes place by means of the operative system or an alike means of the computer system itself, and where the computer system comprises means for measuring the CPU load and/or the CPU temperature. Using the measurement performed by the operative system or alike system of the computer system eliminates the need for special means for operating the pump. Communication between the operative system or alike system and a processor for operating the pump may take place along already established communication links in the computer system such as a USB-link. Thereby, a real-time communication between the cooling system and the operative system is provided without any special means for establishing the communication.

In the case of the motor driving the pump is an AC electrical motor, the above method of controlling the pump may be combined with a method, where said pumping means is provided with a means for sensing a position of the rotor of the electrical motor, and wherein the following steps are employed: Initially establishing a preferred rotational direction of the rotor of the electrical motor, before start of the electrical motor, sensing the angular position of the rotor, during start, applying an electrical AC voltage to the electrical motor and selecting the signal value, positive or negative, of the AC voltage at start of the electrical motor, said selection being made according to the preferred rotational direction, and said application of the AC voltage being performed by the computer system for applying the AC voltage from the electrical power supply of the computer system during conversion of the electrical DC voltage of the power supply to AC voltage for the electrical motor. By the operative system of the computer system itself generating the AC voltage for the electrical motor, the rotational direction of the pump is exclusively selected by the computer system, non-depending on the applied voltage of the public grid powering the computer system.

Further control strategies utilising the operative system or alike system of the computer system may involve balancing the rotational speed of the pump as a function of the cooling capacity needed. If a lower cooling capacity is needed, the rotational speed of the pump, may be limited, thereby limiting the noise generating by the motor driving the pump.

In the case an air fan is provided in combination with a heat sink as shown in FIG. 1, of the air fan is provided in combination with the heat radiator, the operative system or alike system of the computer system may be designed for regulating the rotational speed of the pump, and thus of the motor driving the pump, and the rotational speed of the air fan, and thus the motor driving the air fan. The regulation will take into account the cooling capacity needed, but the regulation will at the same time take into account which of the two cooling means, i.e. the pump and the air fan, is generating the most noise. Thus, it the air fan generally is generating more noise than the pump, then the regulation will reduce the rotational speed of the air fan before reducing the rotational speed of the pump, whenever a lower cooling capacity is needed. Thereby, the noise level of the entire cooling system is lowered as much as possible. If the opposite is the case, i.e. the pump generally generating more noise than the air fan, then the rotational speed of the pump will be reduced before reducing the rotational speed of the air fan.

Even further control strategies involve controlling the cooling capacity in dependence on the type of computer processing taking place. Some kind of computer processing, such as word-processing, applies a smaller load on the processing units such as the CPU than other kinds of computer processing, such as image processing. Therefore, the kind of processing taking place on the computer system may be used as an indicator of the cooling capacity. It may even be possible as part of the operative system or similar system to establish certain cooling scenarios, depending on the kind of processing intended by the user. If the user selects as example word-processing, a certain cooling strategy is applied based on a limited need for cooling. If the user selects as example image-processing, a certain cooling strategy is applied based on an increased need for cooling. Two or more different cooling scenarios may be established depending on the capacity and the control possibilities and capabilities of the cooling system and depending on the intended use of the computer system, either as selected by a user during use of the computer system or as selected when choosing hardware during build-up of the computer system, i.e. before actual use of the computer system.

The pump is not being restricted to a mechanical device, but can be in any form capable of pumping the cooling liquid through the system. However, the pump is preferably one of the following types of mechanical pumps: Bellows pump, centrifugal pump, diaphragm pump, drum pump, flexible liner pump, flexible impeller pump, gear pump, peristaltic tubing pump, piston pump, processing cavity pump, pressure washer pump, rotary lobe pump, rotary vane pump and electro-kinetic pump. Similarly, the motor driving the pumping member need not be electrical but may also be a piezo-electrically operated motor, a permanent magnet operated motor, a fluid-operated motor or a capacitor-operated motor. The choice of pump and the choice of motor driving the pump id dependent on many different parameters, and it is up to the person skilled in the art to choose the type of pump and the type of motor depending on the specific application. As example, some pumps and some motors are better suited for small computer systems such as lab-tops, some pumps and some motors are better suited for establishing i high flow of the cooling liquid and thus a high cooling effect, and even some pumps and motors are better suited for ensuring a low-noise operation of the cooling system.

Figure 7:
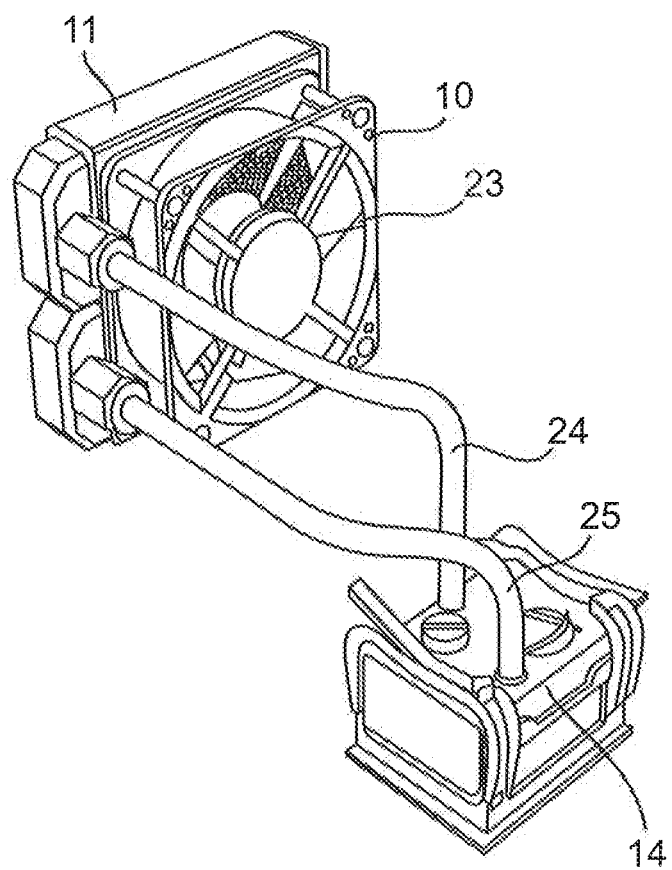
FIG. 7 is a cut-out view into the reservoir housing the pump and an inlet and an outlet extending out of the reservoir.

FIG. 7 is a cut-out view into the reservoir, when the reservoir and the heat exchanging surface 4 is assembled and the pump 21 is situated inside the reservoir. The reservoir is provided with the tube inlet connection (not seen from the figure) through which the cooling liquid enters the reservoir. Subsequently, the cooling liquid flows through the reservoir passing the heat exchanging surface and enters the inlet of the pump. After having been passed through the pump, the cooling liquid is passed out of the outlet of the pump and further out through the tube outlet connection 16. The figure also shows a lid 17 for the reservoir. The flow of the cooling liquid inside the reservoir and trough the pump may be further optimised in order to use as little energy as possible for pumping the cooling liquid, but still having a sufficient amount of heat from the heat exchanging surface being dissipated in the cooling liquid. This further optimisation can be established by changing the length and shape of the tube connection inlet within the reservoir, and/or by changing the position of the pump inlet, and/or for instance by having the pumping device placed in the vicinity and in immediate thermal contact with the heat exchanging surface and/or by providing channels or segments inside the reservoir.

In this case, an increased turbulence created by the pumping device is used to improve the exchange of heat between the heat exchanging surface and the cooling liquid. Another or an additional way of improving the heat exchange is to force the cooling liquid to pass through specially adapted channels or segments being provided inside the reservoir or by making the surface of the heat exchanging surface plate inside the reservoir uneven or by adopting a certain shape of a heat sink with segments. In the figure shown, the inner surface of the heat exchanging surface facing the reservoir is plane.

Figure 8:
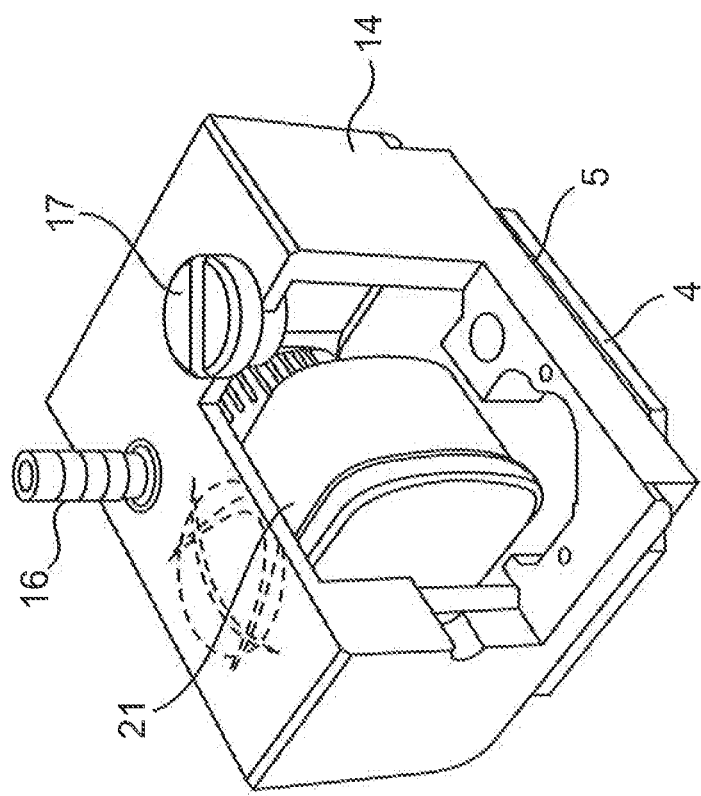
FIG. 8 is a view of the cooling system showing the reservoir connected to the heat radiator.

FIG. 8 is a perspective view of the cooling system showing the reservoir housing 14 with the heat exchanging surface (not shown) and the pump (not shown) inside the reservoir. The tube inlet connection and the tube outlet connection are connected to a heat radiator by means of connecting tubes 24 and 25 through which the cooling liquid flows into and out of the reservoir and the heat radiator, respectively. Within the heat radiator 11, the cooling liquid passes a number of channels for radiating the heat, which has been dissipated into the cooling liquid inside the reservoir, and to the surroundings of the heat exchanger. The air fan 10 blows air past the channels of the heat radiator in order to cool the radiator and thereby cooling the cooling liquid flowing inside the channels through the heat radiator and back into the reservoir.

According to the invention, the heat radiator 11 may be provided alternatively. The alternative heat radiator is constituted by a heat sink, such as a standard heat sink made of extruded aluminium with fins on a first side and a substantially plane second side. An air-fan may be provided in connection with the fins along the first side. Along the second side of the heat sink a reservoir is provided with at least one aperture intended for being closed by placing said aperture covering part of, alternatively covering the whole of, the substantial plane side of the heat sink. When closing the reservoir in such a way a surface of the heat sink is in direct heat exchanging contact with an interior of the reservoir, and thus in direct heat exchanging contact with the cooling liquid in the reservoir, through the at least one aperture. This alternative way of providing the heat radiator may be used in the embodiment shown in FIG. 8 or may be used as a heat radiator for another use and/or for another embodiment of the invention.

A pumping means for pumping the cooling liquid trough the reservoir may or may not be provided inside the reservoir at the heat sink. The reservoir may be provided with channels or segments for establishing a certain flow-path for the cooling liquid through the reservoir. Channels or segments are especially needed when the inner surface of the heat exchanging surface is plane and/or when the inner walls of the reservoir are smooth and/or if the pump is not situated inside the reservoir. In either of the circumstances mentioned, the flow of the cooling liquid inside the reservoir may result in the cooling liquid passing the reservoir too quickly and not being resident in the reservoir for a sufficient amount of time to take up a sufficient amount of heat from the heat exchanging surface. If channels or segments in the reservoir are to be provided inside the reservoir, the shape and of the channels and segments may be decisive of whether the reservoir is to be made of plastic, perhaps by injection moulding, or is to be made of metal such as aluminium, perhaps by die casting.

By means of the alternative heat radiator, the heat radiator 11 is not provided as is shown in the figure with the rather expensive structure of channels leading the cooling liquid along ribs connecting the channels for improved surface of the structure. Instead, the heat radiator is provided as described as a unit constituted by a heat sink with or without a fan and a reservoir, and thereby providing a simpler and thereby cheaper heat radiator than the heat radiator 11 shown in the figure.

The alternative heat radiator provided as an unit constituted by a heat sink and a reservoir, may be used solely, with or without a pump inside the reservoir and with or without the segments or channels, for being placed in direct or indirect thermal contact with a heat generating processing unit such as CPU or with the heat exchanging surface, respectively. These embodiments of the invention may e.g. be used for a reservoir, where the cooling liquid along a first side within the reservoir is in direct heat exchanging contact with the heat generating processing unit such as a CPU and the cooling liquid along a second side within the reservoir is in direct heat exchanging contact with a heat sink. Such a reservoir may be formed such as to provide a larger area of heat exchanging surface towards the heat generating processing unit such as a CPU than the area of the heat exchanging surface facing the heat sink. This may e.g. have the purpose of enlarging the area of the heat exchanging surface so as to achieve an improved heat dissipation form e.g. the CPU to the heat sink than that of a conventional heat sink without a reservoir attached. Conventional heat sinks normally only exchanges heat with the CPU through the area as given by the area of the top side of the CPU. A system comprising a liquid reservoir and a heat sink with a fan provided has been found to be a simple, cost optimised system with an improved heat dissipation than that of a standard heat sink with a fan, but without the reservoir. In another embodiment of the invention, which may be derived from FIG. 8, the air fan and the heat radiator is placed directly in alignment of the reservoir. Thereby, the reservoir housing 14, the air fan 10 and the radiator 11 constitute an integrate unit. Such an embodiment may provide the possibility of omitting the connection tubes, and passing the cooling liquid directly from the heat radiator to the reservoir via an inlet connection of the reservoir, and directly from the reservoir to the heat radiator via an outlet connection of the reservoir. Such an embodiment may even render the possibility of both the pumping device of the liquid pump inside the reservoir and the electrical motor for the propeller of the air fan 23 of the heat radiator 11 being driven by the same electrical motor, thus making this electrical motor the only motor of the cooling system.

When placing the heat radiator on top of the air fan now placed directly in alignment with the reservoir and connecting the heat radiator directly to the inlet connection and outlet connection of the reservoir, a need for tubes will not be present. However, if the heat radiator and the reservoir is not in direct alignment with each other, but tubes may still be needed, but rather than tubes, pipes made of metal such as copper or aluminium may be employed, such pipes being impervious to any possible evaporation of cooling liquid. Also, the connections between such pipes and the heat radiator and the reservoir, respectively, may be soldered so that even the connections are made impervious to evaporation of cooling liquid.

In the derived embodiment just described, an integrated unit of the reservoir, the heat exchanging surface and the pumping device will be given a structure establishing improved heat radiating characteristics because the flow of air of the air fan may also be directed along outer surfaces of the reservoir. If the reservoir is made of a metal, the metal will be cooled by the air passing the reservoir after having passed or before passing the heat radiator. If the reservoir is made of metal, and if the reservoir is provided with segments on the outside surface of the reservoir, such cooling of the reservoir by the air will be further improved. Thereby, the integrated unit just described will be applied improved heat radiating characteristics, the heat radiation function normally carried out by the heat radiator thus being supplemented by one or more of the further elements of the cooling system, i.e. the reservoir, the heat exchanging surface, the liquid pump and the air fan.

FIG. 9-10 show an embodiment of a reservoir housing 14, where channels 25 are provided inside the reservoir for establishing a forced flow of the cooling liquid inside the reservoir. The channels 25 in the reservoir housing 14 lead from an inlet 15 to an outlet 16 like a maze between the inlet and the outlet. The reservoir housing 14 is provided with an aperture 27 having outer dimensions corresponding to the dimensions of a free surface of the processing unit 1 to be cooled. In the embodiment shown, the processing unit to be cooled is a CPU 1.

When channels 26 are provided inside the reservoir, the shape of the channels may be decisive of whether the reservoir is to be made of plastic, perhaps manufactured by injection moulding, or is to be made of metal such as aluminium, perhaps manufactured by extrusion or by die casting.

The reservoir housing 14 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part.

The CPU 1 is intended for being positioned in the aperture 27, as shown in FIG. 10, so that outer boundaries of the CPU are engaging boundaries of the aperture. Possibly, a sealant (not shown) may be provided along the boundaries of the CPU and the aperture for ensuring a fluid tight engagement between the boundaries of the CPU and the boundaries of the aperture. When the CPU 1 is positioned in the aperture 27, the free surface (not shown) of the CPU is facing the reservoir, i.e. the part of the reservoir having the channels provided. Thus, when positioned in the aperture 27 (see FIG. 10), the free surface of the CPU 1 is having direct contact with cooling liquid flowing through the channels 26 in the reservoir.

When cooling liquid is forced from the inlet 15 along the channels 26 to the outlet 16, the whole of the free surface of the CPU 1 will be passed over by the cooling liquid, thus ensuring a proper and maximised cooling of the CPU. The configuration of the channels may be designed and selected according to any one or more provisions, i.e. high heat dissipation, certain flow characteristics, ease of manufacturing etc. Accordingly, the channels may have another design depending on any desire or requirement and depending on the type of CPU and the size and shape of the free surface of the CPU. Also, other processing units than a CPU may exhibit different needs for heat dissipation, and may exhibit other sizes and shapes of the free surface, leading to a need for other configurations of the channels. If the processing unit is very elongate, such as a row of microprocessors, one or a plurality of parallel channels may be provided, perhaps just having a common inlet and a common outlet.

Figure 11:
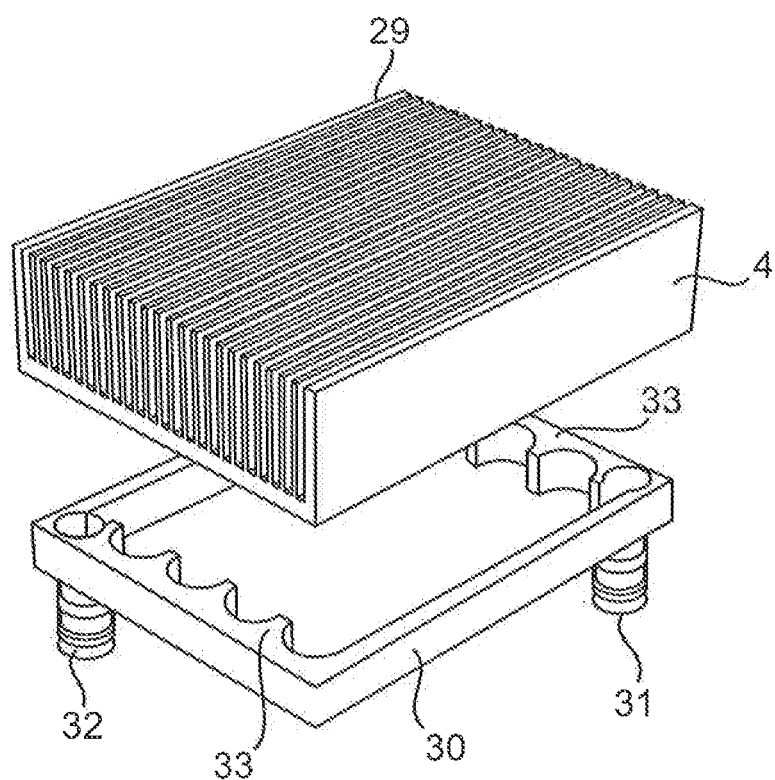
FIG. 11-13 are perspective views of a possible embodiment of heat sink and a reservoir housing constituting an integrated unit.
Figure 12:
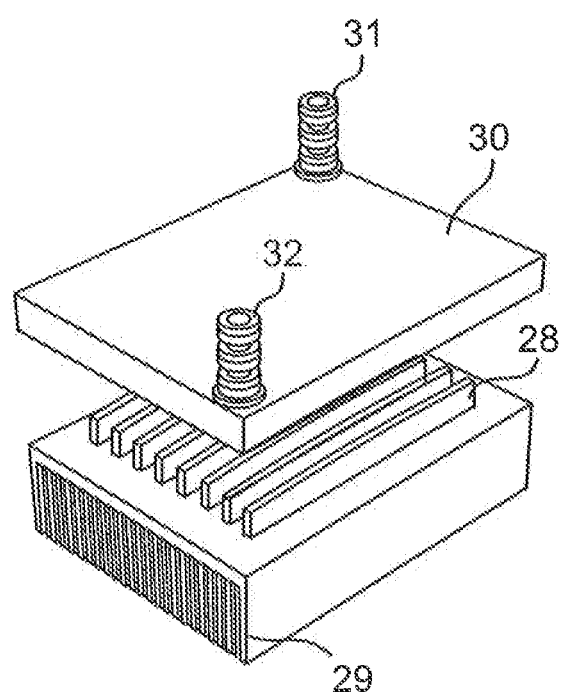
Figure 13:
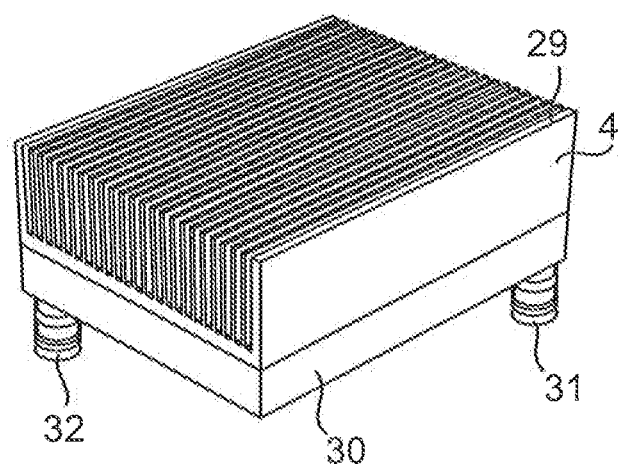

FIG. 11-13 show an embodiment of a heat sink 4, where segments 28 are provided at a first side 4A of the heat sink, and fins 29 for dissipating heat to the surroundings are provided at the other, second side 4B of the heat sink. An intermediate reservoir housing 30 is provided having a recessed reservoir at the one side facing the first side 4A of the heat sink. The recessed reservoir 30 has an inlet 31 and an outlet 32 at the other side opposite the side facing the heat sink 4.

When segments 28 are provided on the first side 4A of the heat sink, the shape of the segments may be decisive of whether the reservoir, which is made from metal such as aluminium or copper, is to be made by extrusion or is to be made by other manufacturing processes such as die casting. Especially when the segments 28 are linear and are parallel with the fins 29, as shown in the embodiment, extrusion is a possible and cost-effective means of manufacturing the heat sink 4.

The intermediate reservoir 30 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part.

The recessed reservoir is provided with a kind of serration 33 along opposite sides of the reservoir, and the inlet 31 and the outlet 32, respectively, are provided at opposite corners of the intermediate reservoir 30. The segments 28 provided at the first side 4A of the heat sink, i.e. the side facing the intermediate reservoir 30, are placed so that when the heat sink is assembled with the intermediate reservoir housing (see FIG. 13) the segments 29 run from one serrated side of the reservoir to the other serrated side of the reservoir.

When cooling liquid is forced from the inlet 31 through the reservoir, along channels (not shown) formed by the segments 29 of the heat sink 4 and to the outlet 32, the whole of the first side 4A of the heat sink will be passed over by the cooling liquid, thus ensuring a proper and maximised heat dissipation between the cooling liquid and the heat sink. The configuration of the segments on the first side 4A of the heat sink and the configuration of the serrated sides of the intermediate reservoir housing may be designed and selected according to any provisions. Accordingly, the segments may have another design, perhaps being wave-shaped or also a serrated shape, depending on any desired flow characteristics of the cooling liquid and depending on the type of heat sink and the size and shape of the reservoir.

Also other types of heat sinks, perhaps circular shaped heat sinks may exhibit different needs for heat dissipation, may exhibit other sizes and shapes of the free surface, leading to a need for other configurations of the segments and the intermediate reservoir. If the heat sink and the reservoir are circular or oval, a spiral-shaped segmentation or radially extending segments may be provided, perhaps having the inlet or the outlet in the centre of the reservoir. If an impeller of the pump is provided, as shown in FIG. 15-16, the impeller of the pump may be positioned in the centre of a spiral-shaped segmentation or in the centre of radially extending segments.

Figure 14:
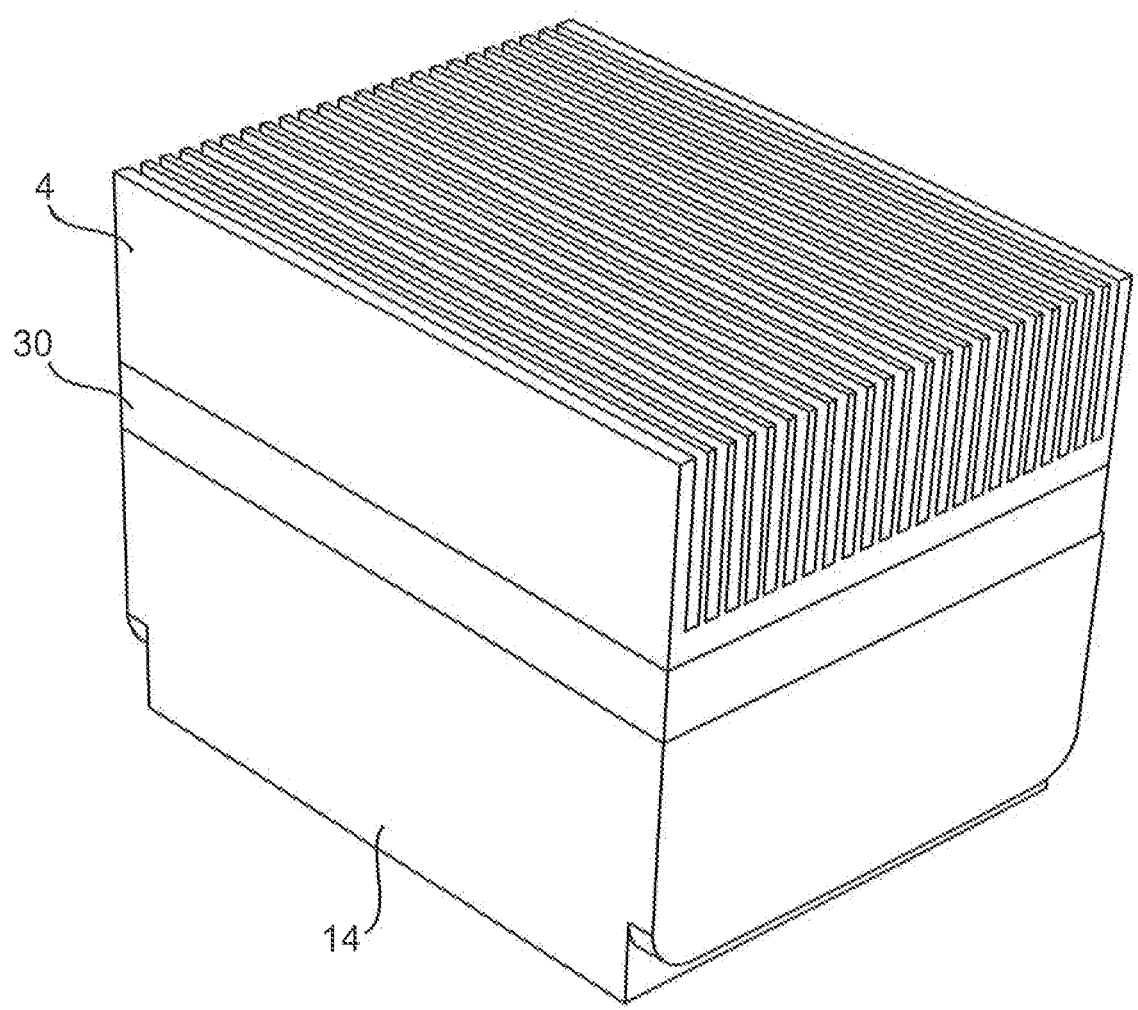
FIG. 14 is a perspective view of the embodiment shown in FIG. 9-10 and the embodiment shown in FIG. 11-13 all together constituting an integrated unit.

FIG. 14 shows the reservoir housing 14 shown in FIG. 9-10 and the heat sink 4 and the intermediate reservoir 30 shown in FIG. 11-13 being assembled for thereby constituting an integrated monolithic unit. It is not absolutely necessary to assemble the reservoir housing 14 of FIG. 9-10 and the heat sink 4 and the intermediate reservoir 30 of FIG. 11-13 in order to obtain a properly functioning cooling system. The inlet 15 and the outlet 16 of the reservoir housing 14 of FIG. 9-10 may be connected to the outlet 32 and the inlet 31, respectively, of the intermediate reservoir of FIG. 11-13 by means of tubes or pipes.

The reservoir housing 14 of FIG. 9-10 and the heat sink 4 and the intermediate reservoir 30 of FIG. 11-13 may then be positioned in the computer system at different locations. However, by assembling the reservoir housing 14 of FIG. 9-10 and the heat sink 4 and the intermediate reservoir 30 of FIG. 11-13 a very compact monolithic unit is obtained, also obviating the need for tubes or pipes. Tubes or pipes may involve an increased risk of leakage of cooling liquid or may require soldering or other special working in order to eliminate the risk of leakage of cooling liquid. By eliminating the need for tubes or pipes, any leakage and any additional working is obviated when assembling the cooling system.

Figure 16:
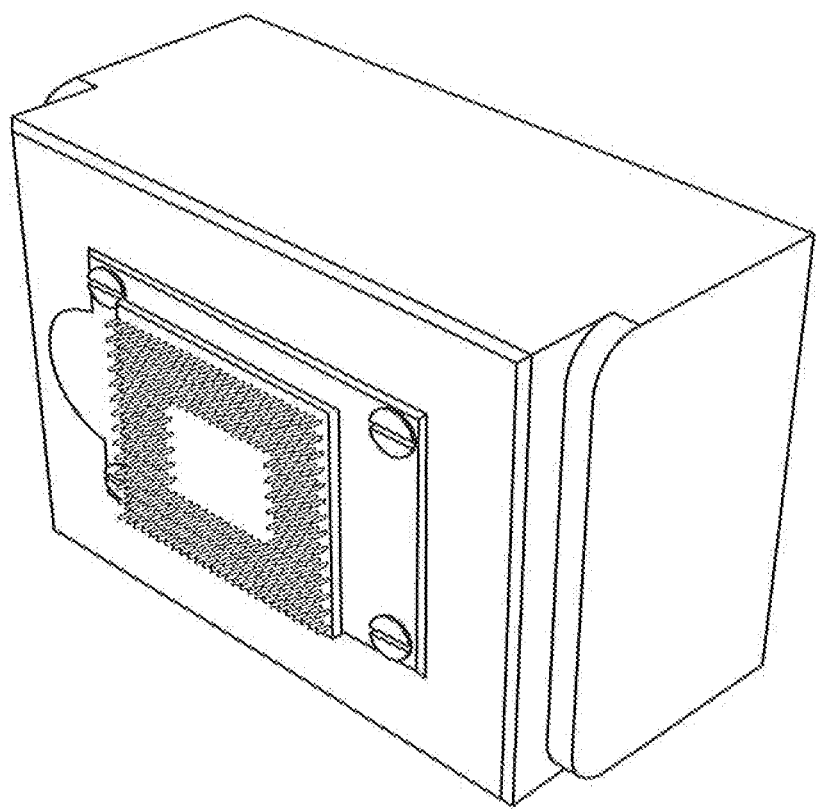

FIG. 15-16 show a possible embodiment of a reservoir according to the invention. The reservoir is basically similar to the reservoir shown in FIG. 9-10. However, an impeller 33 of the pump of the cooling system is provided in direct communication with the channels 26. Also, in the embodiment shown, a heat exchanging interface 4 such as a surface made from a copper plate, alternatively a plate of another material having a high thermal conductivity, is placed between the channels 26 inside the reservoir and the CPU 1 as the processing unit.

The heat exchanging surface 4 is preferably made from a copper plate having a plane outer surface as shown in the figure, said outer surface being intended for abutting the free surface of the heat generating component such as the CPU 1 (see FIG. 4). However, also the inner surface (not shown, see FIG. 7) facing the reservoir is plane. Accordingly, the copper plate need no machining other than the shaping of the outer boundaries into the specially adapted shape used in the embodiment shown and drilling of holes for insertion of the bolts. No milling of the inner and/or the outer surface need be provided.

The provision of the heat exchanging surface 4 need not be a preferred embodiment, seeing that the solution incorporating the aperture (see FIG. 9-10) result in a direct heat exchange between the free surface of the CPU or other processing unit and the cooling liquid flowing along the channels in the reservoir. However, the heat exchanging surface enables usage of the cooling system independently on the type and size of the free surface of CPU or other processing unit. Also, the heat exchanging surface enables replacement, repair or other intervention of the cooling system without the risk of cooling liquid entering the computer system as such and possibly without the need for draining the cooling system fully or partly of cooling liquid.

In the embodiment shown, the heat exchanging surface 4 is secured to the reservoir by means of bolts 22. Other convenient fastening means may be used. The heat exchanging surface 4 and thus the reservoir housing 14 may be fastened to the CPU 1 or other processing unit by any suitable means such as soldering, brazing or by means of thermal paste combined with glue. Alternatively, special means (not shown) may be provided for ensuring a thermal contact between the free surface of the CPU or other processing unit and the heat exchanging surface. One such means may be the fastening means shown in FIG. 4 and FIG. 5 or similar fastening means already provided as part of the computer system.

When channels 26 are provided inside the reservoir housing 14, the shape of the channels may be decisive of whether the reservoir is to be made of plastic, perhaps by injection moulding, or is to be made of metal such as aluminium, perhaps by die casting.

The reservoir housing 14 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part.

The impeller 33 (see FIG. 14) of the pump is positioned in a separate recess of the channels 26, said separate recess having a size corresponding to the diameter of the impeller of the pump. The recess is provided with an inlet 34 and an outlet 35 being positioned opposite an inlet 31 and an outlet 32 of cooling liquid to and from, respectively, the channels 26. The impeller 33 of the pump has a shape and a design intended only for one way rotation, in the embodiment shown a clock-wise rotation only. Thereby, the efficiency of the impeller of the pump is highly increased compared to impellers capable of and intended for both clock-wise and counter clock-wise rotation.

The increased efficiency of the impeller design results in the electric motor (not shown) driving the impeller of the pump possibly being smaller than otherwise needed for establishing a proper and sufficient flow of cooling liquid through the channels. In a preferred embodiment, the electric motor is an AC motor, preferably a 12V AC motor, although the impeller is intended for a DC motor. The contradictory use of an AC motor driving a DC impeller leads to the possibility of an even smaller motor needed for establishing the proper and sufficient flow of cooling liquid through the channels.

The impeller may be driven by an electrical motor at any voltage common in public electrical networks such as 110V or 220V. The power supply of the computer system converts the high voltage AC power to low voltage DC power. Thus, the impeller of the pump may be driven by an AC or a DC electrical motor. As mentioned, preferably the impeller of the pump is driven by an AC electrical motor. Although being technically unnecessary to use an AC electrical motor and being electrically disadvantageous to use an AC electrical motor in a computer system supplying DC electrical power, this may be accomplished by converting part of the DC electrical power of the power supply of the computer system to AC electrical power for the AC motor of the pump. However, in the embodiment shown, the impeller of the pump is driven by a 12V electrical motor.

Figure 17:
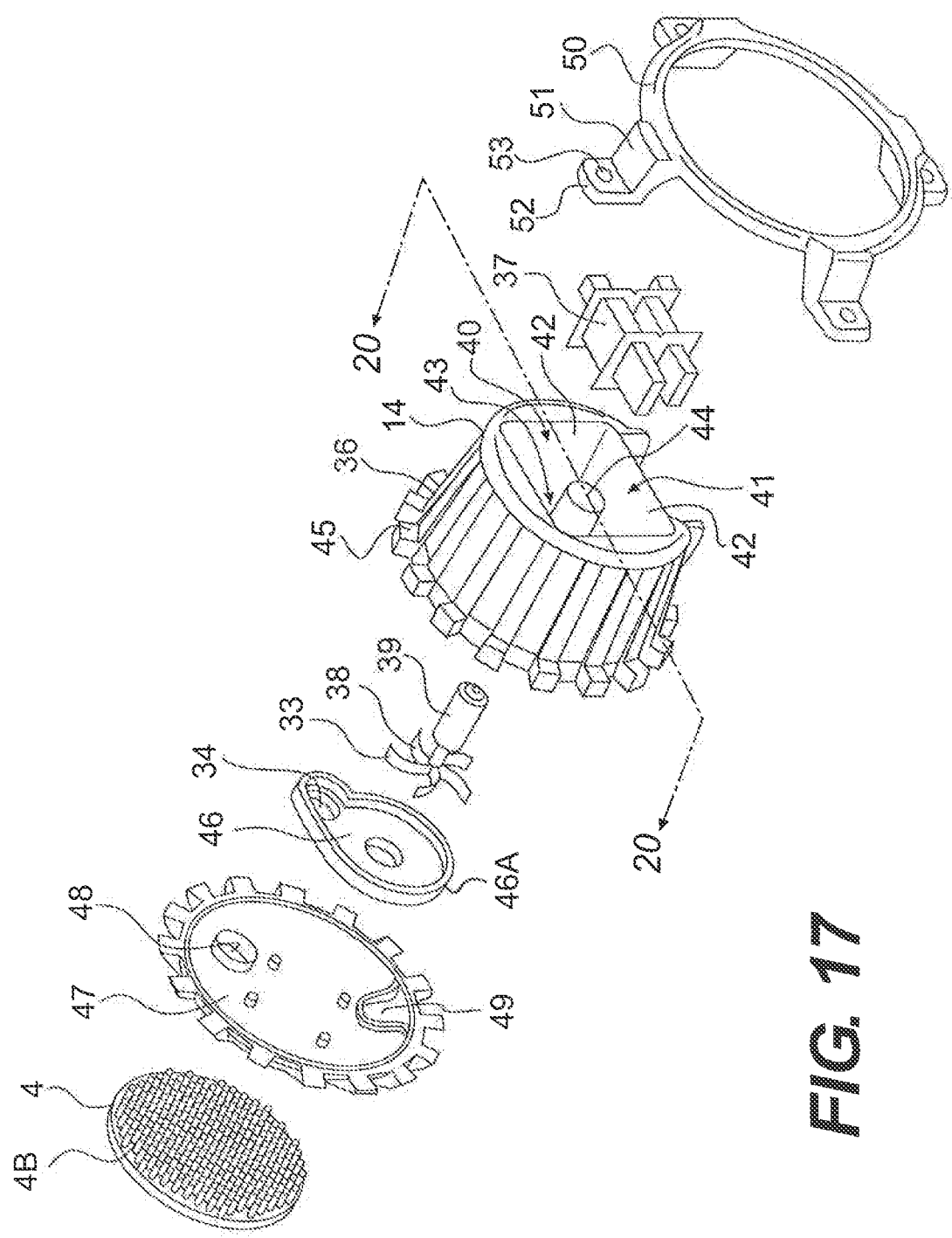
FIG. 17 is a perspective view of a preferred embodiment of a reservoir and a pump and a heat exchanging surface constituting an integrated unit.
Figure 20:
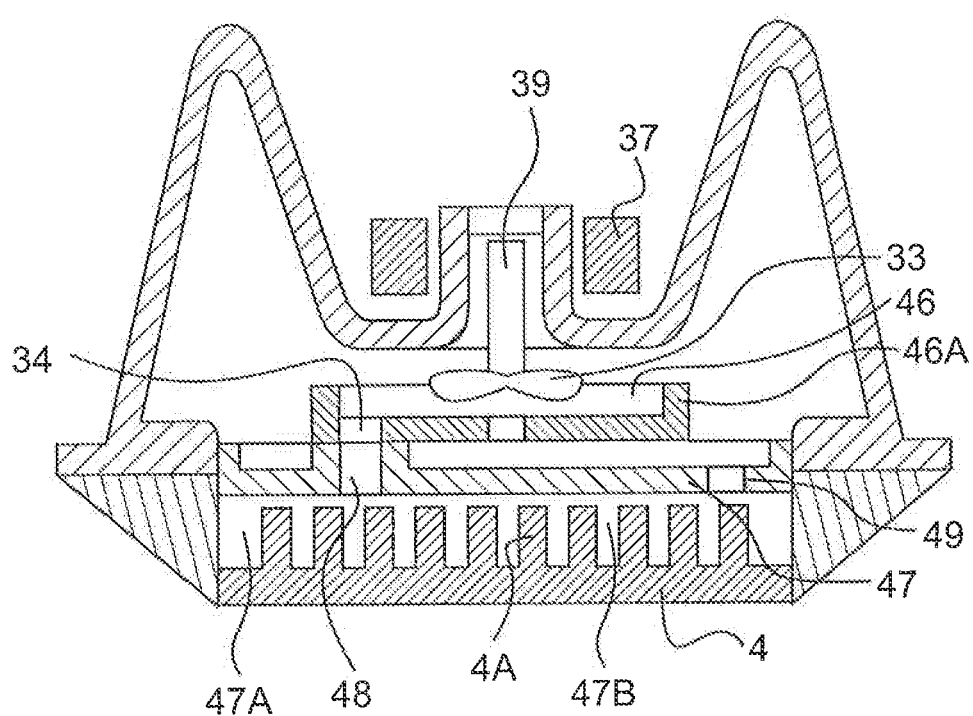
FIG. 20 is a simplified schematic showing a cross-sectional view of the reservoir along plane 20-20 of FIG. 17.

FIG. 17 shows a preferred possible embodiment of a reservoir according to the invention. The reservoir housing 14, as shown in FIGS. 17 and 20, is in the form of a double-sided chassis configured to mount an electrical motor. The reservoir housing 14 has basically the same features as the reservoir housing shown in FIG. 15-16. In the embodiment shown, the reservoir substantially has a conical, circular configuration and is provided with stiffening ribs 36 extending axially along the exterior of the reservoir housing 14.

Other shapes such as cylindrical, circular, or conical rectangular or cylindrical, rectangular or even oval or triangular shapes may be adopted, when designing and possibly injection moulding or casting the reservoir. The dimension of the embodiment shown is approximately 55 mm in diameter and also 55 mm in axial extension.

The reservoir housing 14 has a recess 40 in the centre on the upper side of the reservoir. The recess 40 is intended for accommodating a stator 37 of an electrical motor driving an impeller 33 of the pump, said impeller being attached to a shaft 38 of a rotor 39 of the electrical motor. The recess 40 has an orifice 41, four sidewalls 42, a bottom 43 and a circular jacket 44 extending from the bottom 43 of the recess 40 and outwards towards the orifice 41 of the recess 40. The interior (see FIG. 20) of the jacket 44 is intended for encompassing the rotor 39 of the pump. As shown in FIG. 20, the impeller 33 is housed in a recess on the underside of the reservoir housing 14, the recess being an extension of the interior of the jacket 44.

Thereby, a liquid-proof division is made between the rotor 39 of the motor, said rotor 39 being placed inside the interior of the jacket 44 and being submerged in the cooling liquid, and the stator 37 of the pump, said stator 37 being positioned in the recess 40 and surrounding the exterior of the jacket 44. Accordingly, the stator 37 need not be sealed against the cooling liquid, because the recess 40 together with the jacket 44 ensures the stator staying dry from the cooling liquid, but the stator 37 still being capable of driving the rotor 39, when being supplied with electrical power from a power supply (not shown) of the computer system.

Along an outer circumferential extension, the reservoir housing 14 is provided with protrusions 45 extending outwardly from the circumferential extension. The protrusions are intended for cooperating with a clip (see description below) for fastening the reservoir housing 14 to the CPU or other processing unit of the computer system. The protrusions 45 are shown as a plurality of singular protrusions. Alternatively, the protrusions may be only one continuous protrusion extending outwardly and around the circumferential extension.

The reservoir housing 14 may also be provided with an inlet (not shown) and an outlet (not shown) for the cooling liquid. The inlet and the outlet are provided along a surface of the reservoir facing downward and inwards when seen in the perspective view of the drawing. The inlet and the outlet lead to a radiator (not shown) intended for cooling the cooling liquid after having been heated by the processing unit via a heat exchanging surface (see description below).

The radiator may be placed nearby or distant from the reservoir housing 14, depending on the set-up of the computer system. In one possible embodiment, the radiator is placed in the immediate vicinity of the reservoir, thereby possible excluding any tubing extending between the radiator and the inlet and the outlet, respectively. Such embodiment provides a very compact configuration of the entire cooling system, namely a monolithic configuration where all elements needed for the cooling system are incorporated in one unit.

In an alternative embodiment, the reservoir housing 14 itself also constitutes the radiator of the cooling system. In such embodiment, an inlet and an outlet are not needed. If the reservoir is made of a metal such as copper or aluminium or other material having a high thermal conductance, the cooling liquid, after having been heated by the processing unit via a heat exchanging surface 8 see description below) may radiate the heat via the exterior surface of the reservoir housing 14 itself. In such embodiment, the ribs 36 along the exterior surface of the reservoir housing 14 may also, or may in stead, function as cooling fins. In such embodiment, the fins will have a smaller dimension than the transverse dimension of the ribs 14 shown in FIG. 17, and the number of fins will be greater than the number of fins shown in FIG. 17.

An impeller 33 of the pump of the cooling system is provided in direct communication with a pump chamber 46 formed by impeller cover 46A having an outlet 34 provided tangentially to the circumference of the impeller 33. Thus, the pump functions as a centrifugal pump. The inlet of the pump chamber 46 is the entire opening into the cavity that the pump chamber configures, said cavity being in direct communication with the interior of the reservoir housing 14 as such. An intermediate member 47 is provided between the pump chamber 46 together with the interior of the reservoir and a heat exchanging interface 4. The intermediate member 47 is provided with a first passage 48 for leading cooling liquid from the pump chamber 46 to a thermal exchange chamber 47A provided at the opposite of the intermediate member 47. The intermediate member 47 is provided also with a second passage 49 for leading cooling liquid from the thermal exchange chamber 47A provided at the opposite of the intermediate member 47 to the interior of the reservoir housing 14. Thus, the area enclosed between the underside of the reservoir housing 14 and the heat exchange surface 4 constitutes an enclosed space for circulating the cooling liquid therethrough. The enclosed spaced is divided into two separate chambers by the impeller cover 46A and the intermediate member 47, as shown in FIG. 20. The impeller cover 46A interfaces with the recess on the underside of the reservoir 14 to define the pump chamber 46 which houses the impeller 33, while the intermediate member 47 and the heat exchange surface 4 together define the thermal exchange chamber 47A.

In the embodiment shown, a heat exchanging interface 4 such as a surface made from a copper plate, alternatively a plate of another material having a high thermal conductivity, is placed in thermal communication with the thermal exchange chamber (not shown) at the opposite side of the intermediate member 47.

The heat exchanging interface 4 is preferably made from a copper plate having a plane outer surface (not shown) at the opposite side as the side shown in the figure, said outer surface being intended for abutting the free surface of the heat generating component such as the CPU (see FIG. 4). The inner surface facing the thermal exchange chamber (not shown) at the opposite side of the intermediate member 47 is provided with pins 4B extending from the base of the copper plate and into the thermal exchange chamber (not shown) at the opposite side of intermediate member 47. The pins 4B constitutes an uneven surface and may either be provided during casting of the copper plate or may be provided by means of milling or other machining process of a copper plate. The pins provide a network of channels across the inner surface of the heat exchanging interface, along which network the cooling liquid is intended to flow.

Alternatively, also the inner surface of the copper plate facing the reservoir is plane. In this alternative embodiment, the copper plate need no machining other than the shaping of the outer boundaries into the specially adapted shape used in the embodiment shown. No milling or other machining process of the inner and/or the outer surface need be provided, when both the outer surface and the inner surface is plane.

The provision of the heat exchanging interface 4 need not be a preferred embodiment, seeing that the solution incorporating the aperture (see FIG. 9-10) result in a direct heat exchange between the free surface of the CPU or other processing unit and the cooling liquid flowing along the channels in the reservoir. However, the heat exchanging interface enables usage of the cooling system independently on the type and size of the free surface of CPU or other processing unit. Also, the heat exchanging interface enables replacement, repair or other intervention of the cooling system without the risk of cooling liquid entering the computer system as such and possibly without the need for draining the cooling system fully or partly of cooling liquid.

In the embodiment shown, the heat exchanging interface 4 is secured to the intermediate member 47 by means of gluing or other means ensuring a proper and liquid-tight fastening of the heat exchanging interface with the intermediate member. Any other suitable and convenient means (not shown) for securing the heat exchanging interface to the intermediate member may be envisaged.

The heat exchanging interface and thus the reservoir is fastened to the top of the CPU by means of a clip 50. The clip 50 has a circular configuration and has four legs 51 extending axially from the circular configuration. The four legs 51 are provided with footing 52 and the footings 52 are provided with holes 53. The clip 50 is intended for being displaced around the exterior of the reservoir housing 14 and further axially to the protrusions 45 of the reservoir housing 14.

The clip 50, after having been placed around the reservoir housing 14, is fastened to the motherboard of the computer system by means of bolts (not shown) or the like fastening means extending through the holes 53 in the footings 52 and further though corresponding holes in the motherboard. The corresponding holes in the motherboard are preferably holes already available in the motherboard in the vicinity of the CPU and the socket of the CPU, respectively. Accordingly, the legs 51 and the footings 52 of the clip 50 are specially designed in accordance with the already provided holes in the motherboard.

Alternatively, the heat exchanging interface 4 and thus the reservoir housing 14 may be fastened to the CPU or other processing unit by any other suitable means such as soldering, brazing or by means of thermal paste combined with glue. Alternatively, special means (not shown) may be provided for ensuring a thermal contact between the free surface of the CPU or other processing unit and the heat exchanging interface. One such means may be the fastening means shown in FIG. 4 and FIG. 5 or similar fastening means already provided as part of the computer system.

When stiffening and/or cooling fins 36 are provided at the exterior of the reservoir housing 14, the shape of and the number of fins may be decisive of whether the reservoir is to be made of plastic, perhaps by injection moulding, or is to be made of metal such as aluminium, perhaps by die casting. Also, the purpose of the fins i.e. just for stiffening the reservoir, or also or in stead for cooling purposes, may be decisive of whether the reservoir is to be made of plastic, perhaps by injection moulding, or is to be made of metal such as aluminium, perhaps by die casting.

The reservoir housing 14 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part.

The impeller 33 of the pump has a shape and a design intended only for one way rotation, in the embodiment shown a clock-wise rotation only. Thereby, the efficiency of the impeller of the pump is highly increased compared to impellers capable of and intended for both clock-wise and counter clock-wise rotation.

The increased efficiency of the impeller design results in the electric motor (not shown) driving the impeller of the pump possibly being smaller than otherwise needed for establishing a proper and sufficient flow of cooling liquid through the channels. In a preferred embodiment, the electric motor is an AC motor, preferably a 12V AC motor, although the impeller is intended for a DC motor. The contradictory use of an AC motor driving a DC impeller leads to the possibility of an even smaller motor needed for establishing the proper and sufficient flow of cooling liquid through the channels.

The impeller may be driven by an electrical motor at any voltage common in public electrical networks such as 110V AC power or 220V AC power. The power supply of the computer system converts the high voltage AC power to low voltage DC power. Thus, the impeller of the pump may be driven by either an AC or a DC electrical motor. As mentioned, preferably the impeller of the pump is driven by an AC electrical motor. Although being technically unnecessary to use an AC electrical motor and being electrically disadvantageous to use an AC electrical motor in a computer system supplying DC electrical power, this may be nevertheless be accomplished by converting part of the DC electrical power of the power supply of the computer system to AC electrical power for the AC motor of the pump.

In every aspect of the invention, where an AC motor is used for driving an impeller from a DC motor, although this way of configuring a pump is contradictory, the following preferred mode of operation is established for alleviating the disadvantages:

In order to be able to control direction of rotation of the impeller attached to the rotor and to optimise the conditions of maximum average torque value during starting, i.e. from zero speed up to the synchronous speed, an electronic control circuit is used. The electronic control circuit comprises a processing unit, which drives a static power switch, constituted for example by a triac arranged in series between the alternating-voltage power, which is obtained form the DC power supply of the computer system, and the AC motor. The same series network also includes a detector for the current I which flows through the triac and then through the AC motor. The output of the current detector is an input signal for the electronic processing unit.

The electronic control circuit may also comprise a number or sensors suitable for detecting the position and polarity of the permanent magnets comprised in the rotor of the AC motor, both when the rotor is moving and when it is in particular operating conditions, or when it is motionless or stalled at zero speed. The number of position sensors may be Hall sensors, encoders or optical or electromechanical sensors capable of establishing and/or measuring the position of the rotor. The output signal from the number of position sensors is an input signal for the electronic processing unit.

Alternatively, the output signal from the position sensor may be phase shifted by means of an electronic phase shifting circuit before the output signal is sent to the input of the electronic processing unit.

A third signal may be input to the processing unit, said third signal enabling the processing unit to detect the polarity of the AC voltage applied to the AC motor. However, the third signal is not compulsory.

The signals input to the electronic processing unit are converted into digital form and after being processed by the processing unit, an output signal is provided by the processing unit. The output signal is used for closing or opening the static switch constituted by a triac arranged in series with the AC motor.

In the electronic processing unit, the current signal provided by the current sensor enters a zero-crossing detector which provides in output a logical "1" signal indicating that said current approaches zero with a positive or negative deviation from the zero value of said current. This deviation depends on the type of motor used and on its application, as well as on the type of static power switch being used. The signal arriving from the position sensor enters a phase-shift and processing circuit the output whereof is 1 or 0 according to the position and polarity of the rotor.

In the electronic processing unit, the phase shifted position signal as well as the signal processed from the AC voltage, enter an electronic logic XOR gate which outputs a "1" signal if the digital value of the AC voltage is equal to "0" and the digital value of the phase shifted position signal is equal to "1" or the digital value of the AC voltage is equal to "1" and the digital value of the phase shifted position signal is equal to "0".

The output of the zero-crossing detector and the output of the XOR gate, thus in digital form, enter an electronic logic AND gate which provides in output the control signal for closing or opening the static power switch.

The AND gate with two inputs and the signal processing system allow determining two conditions: 1) the AC voltage signal is positive, the current is proximate to zero, and the rotor rotation angle is between 0 degrees and 180 degrees; 2) the AC voltage signal is negative, the current is proximate to zero, and the rotor rotation angle is between 180 degrees and 360 degrees. These two conditions provide the same rotation direction of the rotor of the AC motor.

Figure 18:
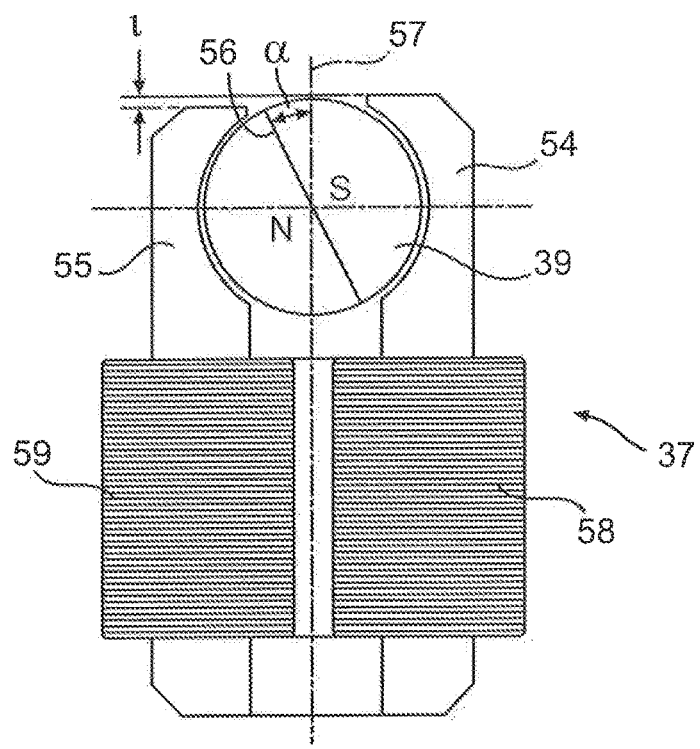
FIG. 18 is a plane view of a possible, however preferred embodiment of an AC electrical motor for a pumping means of the cooling system according to the invention.

FIG. 18 shows an embodiment of an AC motor in which one stator pole 54 is longer than the other stator pole 55 by an amount indicated by I. With this configuration the permanent-magnet rotor 39 with an ideal line 56 separating the north N and the south S of the rotor, is positioned so that the ideal line 56 do not coincide with the median axis 57 of the stator 37, but so that the ideal line 56 is tilted by a certain angle .alpha. in respect to the median 57 of the stator 37.

Two energising windings 58, 59 are provided on the two poles 54,55 of the stator 37, respectively, and the energising windings are connected in series and are powered, through terminals (not shown), by an AC power source. With this configuration of the AC motor, the motor is able to start more easily in an intended rotational direction of the rotor.

In a preferred embodiment of the invention, the control electronics supplies the AC motor with only a half-wave voltage signal during start up, thereby providing torque pulses to the rotor. Since only a half-wave voltage signal is supplied to the motor, the torque pulses are always unidirectional and will therefore force the rotor to start rotating in a required direction. The required direction of rotation is determined by the design of the impeller attached to the rotor and by polarity of the half-wave voltage signal.

After some amount of time, in which a number of half-wave voltage signals has been supplied to the motor, the rotor will stop rotating at a certain position e.g. as shown in the figure. Thus, the rotor is brought into a determined steady state position that is independent of its start position. Subsequent to this process, the AC motor is supplied with a full-wave voltage signal that will accelerate the rotor until the motor enters synchronous operation, that is, when the rotor rotates with the same cyclic frequency as the frequency of the AC voltage source.

The initial polarity of the AC voltage signal is determinative for the resulting direction of rotation of the rotor, thus if the initial voltage is positive with an increasing amplitude, the rotor will start rotating in one direction, whereas if the voltage is negative with a decreasing amplitude, the rotor will start rotating in an opposite direction.

The number of half-waves required for bringing the rotor into a determined steady state position, where the rotor stops rotating, depends on the characteristics of the motor such as moment of inertia and the external load applied to the rotor. Thus, the number of half-waves required is based on empirical analysis of a particular motor in particular load conditions.

Figure 19:
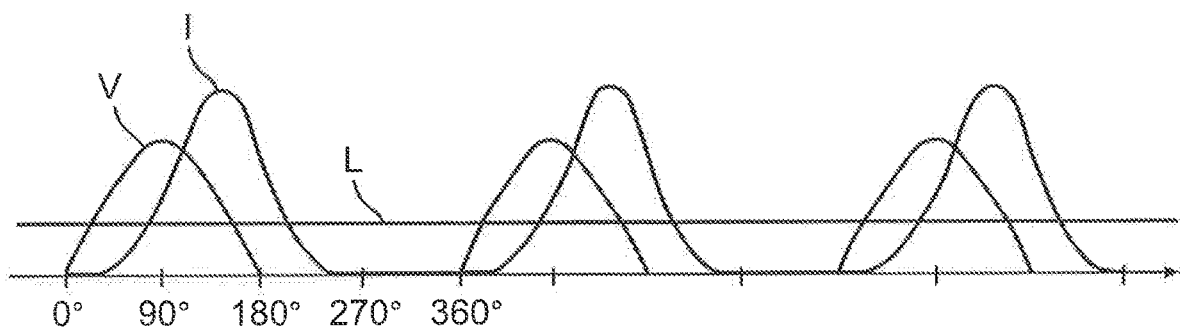
FIG. 19 is a graph showing a method for starting a rotor of the electrical AC motor, said AC motor driving an impeller selected from a pump driven by a DC motor.

The half-wave voltage signal and the corresponding half-wave current signal supplied to the motor will have an appearance as shown in FIG. 19.

In an alternative embodiment the control electrics used to drive the AC motor shown if FIG. 18 is configured so that that the control electronics dictates the AC motor to stop at a predetermined position by supplying the motor with a number of half-wave voltage signals subsequent to the synchronous operation in which the motor was supplied with a full-wave voltage signal. Thus, at the time the motor needs to be started again, the rotor is already in a position so that only the polarity of the full-wave AC voltage signal supplied to the motor must be chosen so that the resulting direction of rotation of the rotor is in conformity with the terminal position of the rotor at the last operation.

According to this method, the initial step of bringing the rotor into a determined steady state position by supplying the motor with a number of half-wave voltage signals is not required. Even in the alternative, it will be possible to both terminate the full-wave power supply with a number of half-wave voltage signals as well as commencing the full-wave power supply by initially supplying the motor with a number of half-wave signals. However, this is more cumbersome, but nevertheless more safe.

FIG. 19 shows a voltage signal V and a current signal I applied to the AC motor as well as the position signal of the rotor. Initially the rotor stands still, which is represented by the straight line L. The electronic control circuit controls the static power switch so that the voltage signal V and the current signal I are present as half-waves. Thus, the rotor receives torque pulses due to the current-voltage combination; these pulses are always one-way directional and tend to start the rotor moving in the required direction. Subsequent to the start-up phase, the rotor enters into its synchronous operation.

Thus, an AC signal is generated, preferably a 12 V AC signal, possibly by means of digital electric pulses from the 12 V DC power supply of the computer's power supply. Based on a possible sensor output relating to the impeller position, a decision is made of how to initiate the AC power signal, i.e. with a negative or positive half-wave, and by doing making sure the impeller starts in the same rotational direction each time and thus the performance benefits of the AC pump is similar to those of a DC pump.

Alternatively, the magnetic field sensor is omitted, and instead of reading the impeller position, the impeller is forced to be in the same position every time the impeller starts. To be sure the impeller is in a defined position before start, a signal is supplied to the stator of the AC motor for a defined period of time. The signal is supplied perhaps three times in a row according to the curvature of the electrical power source. The pulses must be within the same half-wave part of a signal period. The frequency of the pulsed signal is arbitrary, but may be 50/60 Hz, although, despite the fact that under normal circumstances an AC pump being driven by the AC signal from the power outlet of the public electrical power network and transformed from 230/115 V to 12V would not function, as there is no chance of changing the sine signal from the public network.

By this way the impeller will be forced to the right polarity before start, and the pump will start turning the impeller in a defined way of rotation when the power signal full-wave is supplied. The full-wave power signal, which is supplied, must start in the opposite signal half-wave amplitude than that of the initial half-wave pulses, that was supplied before start of the full-wave power signal.

The invention has been described with reference to specific embodiments and with reference to specific utilisation, it is to be noted that the different embodiments of the invention may be manufactured, marketed, sold and used separately or jointly in any combination of the plurality of embodiments. In the above detailed description of the invention, the description of one embodiment, perhaps with reference to one or more figures, may be incorporated into the description of another embodiment, perhaps with reference to another or more other figures, and vice versa. Accordingly, any separate embodiment described in the text and/or in the drawings, or any combination of two or more embodiments is envisaged by the present application.

I claim:

1. A liquid cooling system for cooling a heat-generating component of a computer, comprising:
    a double-sided chassis adapted to mount a pump configured to circulate a cooling liquid, the pump comprising a motor with a stator and an impeller, the impeller being positioned on one side of the chassis and the stator being positioned on an opposite side of the chassis and isolated from the cooling liquid;
    a reservoir adapted to pass the cooling liquid therethrough, the reservoir including:
    a pump chamber including the impeller; and
    a thermal exchange chamber formed below the pump chamber and vertically spaced apart from the pump chamber,
    the pump chamber and the thermal exchange chamber being separate enclosed chambers that are fluidly coupled together by one or more passages;
    a heat-exchanging interface removably coupled to the reservoir, the heat-exchanging interface forming a boundary wall of the thermal exchange chamber and configured to be placed in thermal contact with a surface of the heat-generating component;
    a heat radiator adapted to pass the cooling liquid therethrough, the heat radiator being fluidly coupled to the reservoir and positioned at a location horizontally spaced apart from the heat-generating component, the heat radiator being configured to dissipate heat from the cooling liquid;
    a fan configured to direct air through the heat radiator, the fan being driven by a motor separate from the motor of the pump;
    wherein the thermal exchange chamber includes:
    an inlet that fluidly couples the thermal exchange chamber to the pump chamber via a first passage, the inlet is positioned between a first end and a second end of the thermal exchange chamber;
    wherein the thermal exchange chamber includes at least one outlet configured to direct the cooling liquid out of the thermal exchange chamber, the at least one outlet positioned at either the first end or the second end of the thermal exchange chamber.

2. The cooling system of claim 1, wherein the double-sided chassis is positioned between the stator and the cooling liquid in the reservoir.

3. The liquid cooling system of claim 1, further comprising a clip having legs configured to secure the double-sided chassis, and the heat-exchanging interface to the heat-generating component.

4. The liquid cooling system of claim 1, wherein the double-sided chassis defines a recess configured to house the stator.

5. The liquid cooling system of claim 4, wherein the recess forms at least part of a pump volute.

6. The cooling system of claim 1, wherein the chassis forms a boundary wall of the pump chamber.

7. The cooling system of claim 1, wherein the heat exchanging interface includes a first side and a second side opposite the first side, and wherein the heat-exchanging interface contacts the cooling liquid in the thermal exchange chamber on the first side and the heat-exchanging interface is configured to be in thermal contact with the surface of the heat-generating component on the second side.

8. The cooling system of claim 7, wherein the first side of the heat-exchanging interface includes features that are adapted to increase heat transfer from the heat-exchanging interface to the cooling liquid in the thermal exchange chamber.

9. The cooling system of claim 8, wherein the features include at least one of pins or fins.

10. The cooling system of claim 1, wherein the impeller is positioned in the pump chamber.

11. The cooling system of claim 1, wherein the impeller includes a plurality of curved blades is configured for one-way rotation.

12. The cooling system of claim 1, wherein the pump is a centrifugal pump.

* * * * *